US006624433B2

United States Patent
Okumura et al.

(10) Patent No.: US 6,624,433 B2
(45) Date of Patent: *Sep. 23, 2003

(54) METHOD AND APPARATUS FOR POSITIONING SUBSTRATE AND THE LIKE

(75) Inventors: Masahiko Okumura, Tokyo (JP); Kenji Nishi, Kanagawa-ken (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/290,867

(22) Filed: Apr. 14, 1999

(65) Prior Publication Data

US 2002/0113218 A1 Aug. 22, 2002

Related U.S. Application Data

(63) Continuation of application No. 08/605,787, filed on Feb. 22, 1996, now abandoned, which is a continuation-in-part of application No. 08/391,648, filed on Feb. 21, 1995, now abandoned.

(30) Foreign Application Priority Data

Feb. 22, 1994 (JP) .............................................. 6-024536
Feb. 24, 1995 (JP) .............................................. 7-036432

(51) Int. Cl.$^7$ ........................ G01N 21/86; G01B 11/00; G01B 11/14
(52) U.S. Cl. ........................ 250/548; 356/400; 356/620
(58) Field of Search .................. 250/548; 356/399–401, 356/620; 355/53, 55

(56) References Cited

U.S. PATENT DOCUMENTS

| | | | | | |
|---|---|---|---|---|---|
| 4,870,288 | A | * | 9/1989 | Abuku et al. ................ | 250/548 |
| 4,891,526 | A | * | 1/1990 | Reeds ......................... | 356/401 |
| 4,955,780 | A | * | 9/1990 | Shimane et al. .......... | 414/744.2 |
| 5,044,752 | A | * | 9/1991 | Thurfjell et al. ............ | 250/548 |
| 5,563,798 | A | * | 10/1996 | Berken et al. .............. | 700/218 |
| 5,917,601 | A | * | 6/1999 | Shimazaki et al. .......... | 356/400 |

FOREIGN PATENT DOCUMENTS

| | | |
|---|---|---|
| JP | 63-107139 | 5/1988 |
| JP | 63-280435 | 11/1988 |

* cited by examiner

*Primary Examiner*—Zandra V. Smith
(74) *Attorney, Agent, or Firm*—Armstrong, Westerman & Hattori, LLP

(57) ABSTRACT

A positioning method and apparatus for positioning a substrate on a substrate stage which is movable in a predetermined direction (Y direction). In the positioning method, a relationship between a longitudinal direction (X' direction) of a band-shaped light beam irradiated onto the substrate and the predetermined direction (Y direction) for determining the position of the substrate and the predetermined direction is measured and the substrate is positioned on the substrate stage based on the relationship between said longitudinal direction of the band-shaped light beam and the predetermined direction.

30 Claims, 15 Drawing Sheets

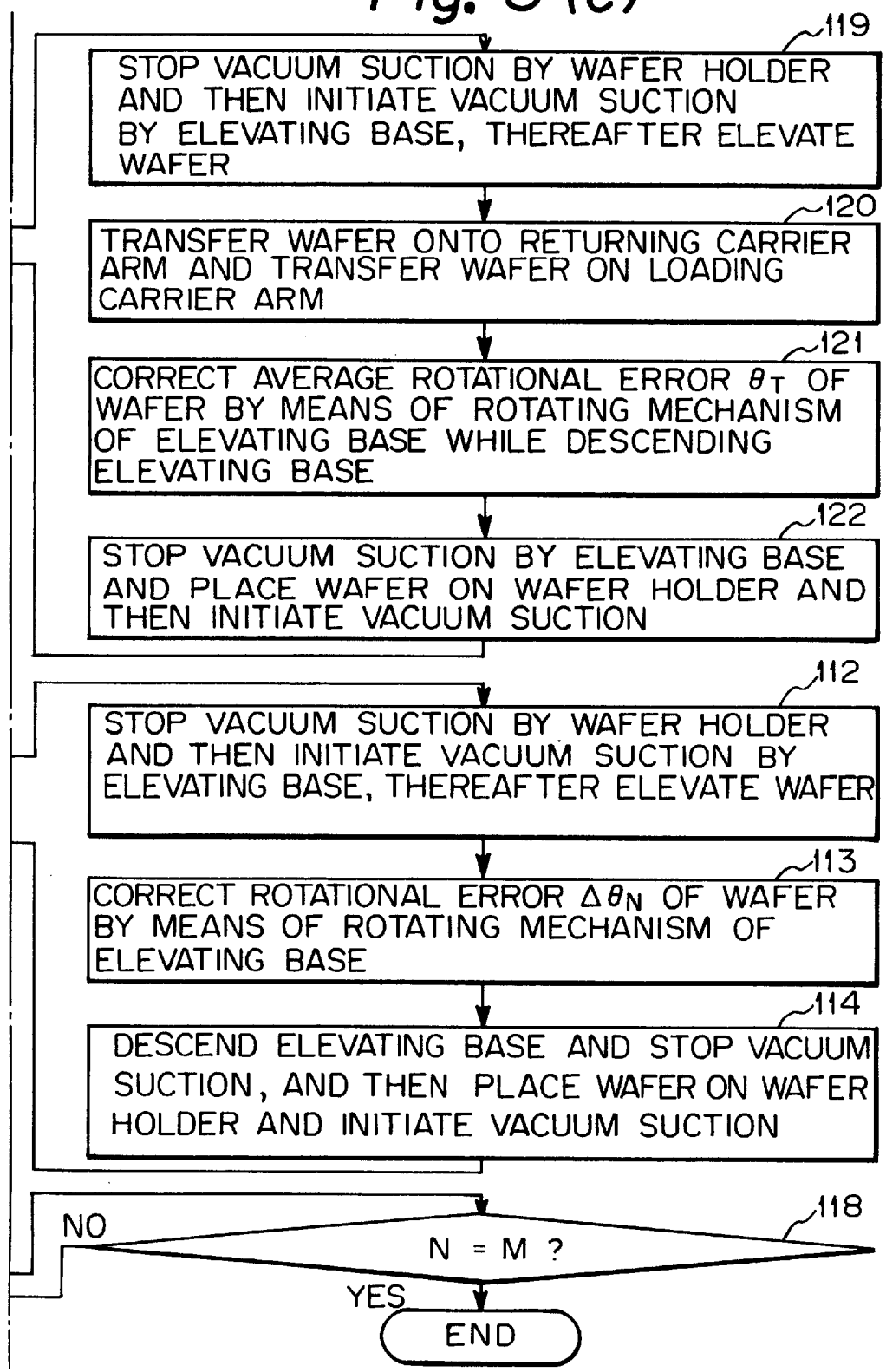

METHOD AND APPARATUS FOR POSITIONING SUBSTRATE AND THE LIKE

BACKGROUND OF THE INVENTION

This application is a continuation of Ser. No. 08/605,787, filed Feb. 22, 1996, now abandoned which is a continuation-in-part application of U.S. patent application Ser. No. 08/391,648, filed Feb. 21, 1995, now abandoned and, relates to a method and an apparatus for positioning a photosensitive substrate such as a wafer, a glass mask and the like on a stage when in an exposure apparatus a pattern on a mask (or reticle) is transferred onto the photosensitive substrate.

FIELD OF THE INVENTION

In particular, the invention relates to a method and an apparatus adapted to be used for positioning the photosensitive substrate in a direction of rotation in an exposure apparatus (a stepper, an aligner and the like) for producing a semiconductor device, a charge coupled device (CCD), a liquid crystal indication element, a thin film magnetic head and the like.

RELATED BACKGROUND ARTS

In a projection exposure apparatus such as a stepper and the like which is used in manufacturing a semiconductor device, a liquid crystal indication element and the like, it is desired to position (or align) with high accuracy a reticle which constitutes a mask with a wafer (or a glass mask and the like) which constitutes a photosensitive substrate, in order to transfer a circuit pattern formed on the reticle onto a photoresist layer on the wafer with high alignment accuracy.

There are various types of alignment sensors used in the alignment system, one of which is an LSA (Laser Step Alignment) type, such as shown in Japanese Patent Laid-Open Publication No. Hei 5-21324, in which a laser beam is irradiated to a doted-line-shaped alignment mark on a wafer and the position of the alignment mark is detected on the basis of the beam diffracted or scattered by the mark, another is an FIA (Field Image Alignment) type in which an image of an alignment mark is taken by illuminating with the light having a wide wave band width and emitted from a halogen lamp as a light source and the position of the alignment mark is measured by image-processing the obtained image data, and yet another is an LIA (Laser Interferometric Alignment) type in which a diffraction grating-shaped alignment mark on a wafer is irradiated from two different directions with two laser beams having slightly different frequencies with each other, and two diffracted beams emitted thereby interfere with each other to thereby enable the position of the alignment mark to be measured using the phase between the two diffracted beams. Alignment systems can be roughly divided into a TTL (Through-The-Lens) type in which the position of a wafer is detected through an optical projection system, a TTR (Through-The-Reticle) type in which a positional relationship between a reticle and a wafer is measured through an optical projection system and the reticle, and an Off-Axis type in which the position of a wafer is directly detected without using an optical projection system.

The position of a wafer not only in a translational direction and but also in a direction of rotation (angle of rotation) is detected by detecting the positions of at least two points on a wafer placed on a wafer stage by means of these alignment sensors. There are several alignment sensors such as a TTL and LIA (Laser Interferometric Alignment) type, and a TTL and LSA (Laser Step Alignment) type and an Off-Axis and FIA (Field Image Alignment) type as a sensor used in measuring an angle of rotation of the wafer.

For the projection exposure apparatuses, it is desired to align a reticle and a wafer with high accuracy based on detected results by these alignment sensors while reducing the time required for effecting an alignment of the reticle and the wafer and maintaining a high productivity (throughput). Therefore, it is necessary to increase productivity in all steps from a step in which a wafer is transferred to a wafer stage to the final exposure step. Referring to FIG. 1, the operation in a transfer process of a wafer prior to the final alignment of the wafer in the conventional exposure apparatus will be explained, hereinafter.

FIG. 1 shows a structure around a wafer stage explaining a transfer mechanism for a wafer in a conventional exposure apparatus. In FIG. 1, a state in which a substrate or wafer W is transferred from a wafer carrier device onto an elevating or vertically movable device g disposed through a telescoping mechanism f on an X stage a. The elevating device g includes three supporting pins (in FIG. 1, two supporting pins $g_1$ and $g_2$ are shown) which are loosely inserted into openings formed in each of a sample table c, a θ rotation correction mechanism d and a wafer holder e with play therebetween. The elevating device operates such that three supporting pins thereof moves the wafer W up and down by upward and downward movement of the telescoping mechanism in response to a transfer operation of the wafer. Each supporting pin $g_1$, $g_2$ or $g_3$ is adapted to suck the lower surface of the wafer by vacuum suction generated by an external vacuum pump to hold the wafer so that it does not move or displace when the elevating device is moved up and down.

After the wafer W is stationarily held on the wafer holder e by vacuum suction, the alignment sensor generates a detection signal of alignment marks formed on the opposite ends of the wafer W and a rotational error or angular error on a coordinate system of the wafer stage is calculated by obtaining the coordinates of the sample table c, for example, when a detected signal reaches its peak and is measured by means of a movable mirror h fixed on the end of the sample table c and an external interferometer (not shown). The rotational error of the wafer W is eliminated by driving the θ rotation correction mechanism (θ table) d on the sample table e based on the obtained results, thereby carrying out alignment of the reticle and the wafer W in the direction of rotation.

In the prior art as explained above, the θ rotation correction mechanism d for rotating the wafer is provided between the wafer W and the sample table e which is a reference of the coordinate system of the wafer stage system and is provided with the movable mirror h thereon. This results in some inconveniences that the wafer W is displaced in a lateral direction when vacuum suction of the wafer holder for holding the wafer W is weak, that the rigidity of the entire stage becomes weak since complex mechanisms are provided on the sample table c and that the control performance of the stage cannot be increased since the weight of the entire stage increases. Therefore, it may be intended, for example, that the θ rotation correction mechanism is arranged below the sample table c. In this case, however, angle of rotation of the θ rotation correction mechanism is limited when the θ rotation correction mechanism is driven to adjust the angle of rotation of the wafer W, since the angle of a light beam from the laser interferometer which strikes the movable mirror h on the sample table c varies. Therefore, for example, if accuracy of pre-alignment of the wafer is not good, the rotational error cannot be sufficiently corrected.

Also in the prior arts, when an alignment sensor of a diffracted light detection type such as the LAS type or the LIA type, particular detection errors are created in response to an angle of inclination between an alignment mark on a wafer W and the light beam for detecting a position.

FIGS. 2(a) and 2(b) illustrate a state in which laser beam is irradiated to an alignment mark. FIG. 2(a) shows a state in which an alignment mark (grating-shaped) for the LIA type is irradiated with a laser beam and FIG. 2(b) shows a state in which an alignment mark (doted-line-shaped mark) for the LSA type is irradiated with a laser beam. As shown in FIG. 2(a), in the alignment system of the LIA type, a grating-shaped alignment mark is irradiated from two directions with two laser beams each having a rectangular irradiation region and the wafer is positioned on the basis of a phase of the interfered light of two diffracted lights form the alignment marks. In FIG. 2(a), an irradiation region $RA_1$ of the laser beam is inclined by $\Delta\theta_A$ with respect to a central axis $GM_y$ extending along a longitudinal direction (non-measuring direction) of a grating-shaped mark GM which is formed by a plurality of gratings arranged with a predetermined pitch in a right and left direction.

Also, as shown in FIG. 2(b), in the alignment system of the LSA type, a dotted-line-shaped mark DM formed from a plurality of small square patterns arranged in an upward and downward direction with a predetermined pitch is scanned with a laser beam which is condensed at a slit-shaped irradiation region $RA2_y$ and the position at which a quantity of an interfered light form the marks becomes maximum is detected. In FIG. 2(b), a central axis $DM_y$ extending along a longitudinal direction of a slit-shaped irradiation region $RA_2$ of the laser beam is inclined by $\Delta\theta_B$ with respect to a central axis $DM_y$ extending along the direction of arrangement (non-measuring direction) of the doted-line-shaped mark DM.

Therefore, in both cases shown in FIGS. 2(a) and 2(b), it may occur that positional detection errors are created due to an angle of inclination between the alignment mark and the laser beam. That is, since photoresist is applied on the alignment mark, if a difference in intensity of the diffracted beam returned from the alignment mark is created due to a difference in film thickness of the photoresist which depends on difference in position in the non-measuring direction of the mark, the position of the mark is detected such that it is shifted toward a side where the intensity of the returned light is great. Therefore, the detected error by the LIA system shown in FIG. 2(a) becomes $L3\times\Delta\theta_A$ in maximum which is a product of the length L3 of the grating-shaped mark GM in a longitudinal direction thereof and an angle $\Delta\theta_A$. On the other hand, the detection error by the LSA system shown in FIG. 2(b) becomes $L4\times\Delta\theta_B$ in maximum which is a product of the length L4 of the dotted-line-shaped mark DM and the angle $\Delta\theta_B$. However, according to prior arts these detection error cannot be deleted easily.

On the other hand, there is a known positioning or aligning apparatus which, when a wafer is placed on an exposure or substrate stage, detects the position of an outer peripheral edge of the wafer without contacting the wafer and positions the wafer on a substrate stage so that it is placed at a predetermined position on the substrate stage and an orientation-flat (hereinafter refer to as "flat") becomes parallel with a direction of movement of the substrate stage (for example, the direction X).

Such a prior art apparatus for positioning the wafer with respect to the exposure stage in the non-contact way is disclosed, for example, in Japanese Patent Laid-Open Publication No. Sho 63-280435. According to this prior art apparatus, the wafer is put on a rotary table of a pre-alignment device provided adjacent to the exposure stage, a peripheral configuration of the wafer is photoelectrically detected as the wafer is rotated. Next the position of the wafer and the direction of the flat formed on the wafer are compensated so that they are at the predetermined position and direction, before the wafer is mounted on the exposure stage. Thereafter, the wafer is carried from the pre-alignment device to the exposure stage by means of a carrier arm keeping its' posture as it is, whereby the wafer is positioned in the predetermined place on the exposure stage so that the direction of the flat is parallel with one (X direction) of the moving directions of the exposure stage. In the wafer positioned on the exposure stage by the positioning apparatus as mentioned above, however, the position thereof with respect to the exposure stage and parallelism of the flat with respect to the X direction become disordered and the position and the parallelism become uneven wafer by wafer with respect to the exposure stage during two transfer operations of wafer W, that is, when the wafer is transferred from the pre-alignment device to a carrier arm and when it is transferred from the carrier arm to an exposure stage.

On the other hand, there is disclosed in Japanese Patent Laid-Open Publication No. Sho 63-107139 a method for detecting the position of a wafer and the direction of the flat with respect to the X direction in order to effect the pre-alignment of the wafer more precisely after the wafer, the position of which and the direction of the flat are compensated by the pre-alignment described above, is mounted on the exposure stage. This method uses a laser beam irradiating an alignment mark on the wafer when fine alignment (a precise position alignment between the wafer and a projected image of a circuit pattern) is performed, scanning two separated points on the flat portion of the wafer held on the stage and two points on the circular peripheral edge of the wafer by the laser beam, thereby obtaining a rotational error (an offset in the direction of rotation of the wafer) of the flat with respect to said one moving direction (X direction) of the stage and X-Y coordinate positions. After this the direction of the flat formed on wafer coincides with the X direction by rotation of a wafer holder holding the wafer on the basis of the rotational errors.

As shown in U.S. Pat. Nos. 4,407,627 and 4,345,836, there has been proposed a structure which performs a more precise pre-alignment by providing a second pre-alignment mechanism wherein the wafer, the position of which and the direction of the flat formed on which are compensated is mechanically pushed against a positioning pin or pins provided on the exposure stage, after the wafer are placed thereon.

However, when the positioning of the wafer is performed by using the laser beam for a fine-alignment, a plurality of measurement points on the periphery of the wafer should be moved to the irradiation position where the laser beam is irradiated on the wafer. This results in an increase of displacement of the exposure stage and reduction of a throughput.

On the other hand, when the pre-alignment is performed by making the second pre-alignment mechanism mechanically contact with the periphery of the wafer, contaminants such as photoresist or the like attached to the wafer are scattered within the apparatus and on the wafer, thereby preventing improvement in an yield rate of semiconductor chips. Moreover, since the pre-alignment mechanism provided outside the apparatus and a carrier arm for carrying the wafer from the outside pre-alignment mechanism to the exposure stage are the same as those of the apparatus having no second pre-alignment mechanism, it is difficult to improve positioning accuracy.

SUMMARY OF THE INVENTION

The main object of the present invention is to provide a positioning method and apparatus which is capable of eliminating detection errors caused by an angular error between a light beam of an alignment sensor of diffracted light detection type and an alignment mark to position a substrate such as wafer or the like with high accuracy.

Another object of the present invention is to provide a positioning method in which the structure of a substrate stage is simplified to thereby enabling improvement in rigidity of the substrate stage and decrease of weight thereof, and, as a result, positioning of the substrate can be performed rapidly and with high accuracy.

A further object of the present invention is to provide a positioning method in which a band-shaped light beam is irradiated to a mark formed on a substrate to detect the position of the substrate with respect to a substrate stage and measure mutual relation between the direction of the band-shaped light beam and the direction of the substrate stage, and in which the substrate is positioned with low cost by moving a mask pattern and the substrate on the basis of the measured results.

A further object of the present invention is to provide a positioning method in which an angular error of a substrate relative to a predetermined two dimensional coordinate system is obtained and the angular error is corrected by relatively rotating the substrate with respect to a substrate holder of a substrate stage, thereby quickly performing positioning of the substrate to improve throughput of the apparatus.

A further object of the present invention is to provide an aligning method for aligning a substrate held on a substrate stage which is movable in a predetermined direction with a mask pattern on a mask.

A yet another object of the present invention is to provide a positioning apparatus for a substrate which is capable of positioning the substrate such as a wafer or etc. with respect to a stage capable of moving in two dimensions, without decreasing throughput of the apparatus.

A yet another object of the present invention is to provide a positioning apparatus for positioning a substrate so that a straight or flat portion (a flat) on the periphery of the substrate is always oriented toward a predetermined direction with respect to a holder for holding the substrate.

A yet another object of the present invention is to provide a positioning apparatus for a substrate which is capable of positioning the substrate rapidly and with high accuracy by detecting a straight or flat portion of the substrate without contacting the wafer while the substrate is in the position on the holder.

A yet another object of the present invention is to provide a positioning apparatus for positioning a substrate so that a straight or flat portion on the periphery of the substrate is always oriented toward a predetermined reference position with respect to a holder when the position of the holder in the direction of rotation is in a neutral position.

A first positioning method according to the present invention relates to a method for positioning a substrate on a substrate stage which is movable in a predetermined direction (Y direction) and includes steps of measuring a relationship between a longitudinal direction (X' direction) of a band-shaped light beam irradiated onto said substrate and said predetermined direction (Y direction) to detect the position of said substrate in said predetermined direction; and positioning said substrate on said substrate stage based on the relationship between said longitudinal direction of said band-shaped light beam and said predetermined direction.

In this case, it is preferable to position the substrate on the substrate stage based on the relation between a longitudinal direction of the band-shaped light beam and the predetermined direction.

A second positioning method according to the present invention relates to a method for positioning a substrate on a substrate holder on the basis of a predetermined two dimensional coordinate system and includes steps of obtaining a rotational error of the substrate placed on the substrate holder with respect to said two dimensional coordinate system; and taking out said substrate from said substrate holder and then rotating said substrate so that said rotational error is corrected, thereafter placing again said substrate onto said substrate holder.

In this case, preferably, a minute rotational or angular error of the substrate with respect to the two dimensional coordinate system may be measured after the rotational error of the substrate is corrected and then a mask pattern may be rotated so that the minute rotational error is corrected.

A third positioning method according to the present invention relates to a method for positioning a substrate having a straight section formed at a part of the outer periphery thereof with respect to a substrate holder which is rotatably disposed on a two dimensionally movable substrate stage and has a flat section formed at a part of the outer periphery thereof and includes steps of moving a roughly pre-aligned substrate to a position above said substrate holder; irradiating parallel light beams from above the substrate holder to at least two portions on said flat section and at least one portion on another outer periphery toward said substrate holder; measuring quantity of light reached said substrate holder by means of sensors to obtain an angular error of said substrate relative to said substrate holder; rotating the substrate holder relative to said substrate by an angle equal to the obtained angular error; and rotating the substrate holder in the opposite direction by said angle after the substrate is placed on the substrate holder.

A forth positioning method according to the present invention relates to a method for positioning a substrate having a straight section formed at a part of the outer periphery thereof with respect to a substrate holder which is rotatably disposed on a two dimensionally movable substrate stage and has a flat section formed at a part of the outer periphery thereof and includes steps of moving a roughly pre-aligned substrate to a position above the substrate holder; irradiating parallel light beams from above said substrate holder to at least two portions on said flat section and at least one portion on another outer periphery toward the substrate holder; measuring the quantity of light which reaches said substrate holder by means of sensors to obtain an angular error of said substrate relative to said substrate holder; and placing said substrate onto said substrate holder after said substrate is relatively rotated with respect to the substrate holder by an angle equal to the angular error.

A first aligning method according to the present invention relates to a method for aligning a substrate held on a substrate stage which is movable in a predetermined direction with a mask pattern on a mask and includes steps of measuring a relationship between a longitudinal direction of a band-shaped light beam and said predetermined direction to detect the position of said substrate in said predetermined direction; and aligning said mask and said substrate with each other based on said relationship between said longitudinal direction of said band-shaped light beam and said predetermined direction.

A second aligning method according to the present invention relates to a method for aligning a substrate held on a substrate stage with a pattern on a mask based on a predetermined two dimensional coordinate system and includes steps of obtaining a rotational error of said substrate placed on said substrate holder relative to said two dimensional coordinate system; separating said substrate from said substrate holder and then rotating said substrate to correct said rotational error; thereafter placing again said substrate on said substrate holder; measuring a minute rotational error of said substrate with respect to said two dimensional coordinate system after said correction of said rotational error of said substrate finished; and rotating said mask to correct said minute rotational error.

According to the positioning or aligning method of the present invention as explained above, as shown in FIG. 6(a), an angle of rotation $\theta_{LSAY}$ of a longitudinal direction (X' direction) of a band-shaped light beam from an alignment sensor relative to a coordinate system of the substrate stage, and, for example, a mask pattern and a substrate is rotated by the angle of rotation $\theta_{LSAY}$ with respect to a predetermined direction of movement of the substrate stage. Since the substrate is rotated in correspondence with the direction of the band-shaped light beam from the alignment sensor, the rotational error between the band-shaped light beam and the substrate is removed by an alignment and positional detection error is removed.

Moreover, when the substrate is positioned on the substrate stage in consideration of a relation between the longitudinal direction of the band-shaped light beam and the predetermined direction, the rotational error between a mark on the substrate on the substrate stage and the band-shaped light beam from the alignment sensor is reduced.

According to the other positioning or aligning methods of the present invention, since a rotational error ($\Delta\theta_N$) of the substrate relative to a predetermined coordinate system is obtained and the substrate is separated from the substrate holder, thereafter, the substrate is rotated so that the rotational error is corrected, the substrate is placed on a substrate holder, no rotation correction mechanism is required for a substrate stage. Therefore, the substrate stage is improved in rigidity and its weight is reduced.

Further, if a minute rotational error in the substrate relative to a two dimensional coordinate system is measured after a rotational error of the substrate is corrected and a mask pattern is rotated so that the minute rotational error is corrected, alignment of the substrate in a rotational direction is rapidly performed without providing a mechanism for correcting the minute rotational error, for example, for the substrate stage.

A first positioning apparatus according to the present invention relates to an apparatus for positioning a substrate on a substrate stage which is movable in a predetermined direction and comprises a reference mark member mounted on said substrate stage and having a reference mark formed thereon; an alignment sensor which is capable of selectively irradiating a band-shaped light beam onto said reference mark member and said substrate placed on said substrate stage; an elevating base which is disposed above said substrate stage and is vertically movable and rotatable independently from said substrate stage to receive said substrate transferred to a position above said substrate stage and place it on said substrate stage; and a drive mechanism for vertically moving and rotating said elevating base.

Another positioning apparatus for a substrate according to the present invention includes a stage two dimensionally movable in a predetermined reference plane; a holder for holding a substrate having a straight portion on at least a part of the periphery thereof; a holding member for holding the substrate above the stage in a parallel relationship with respect to the reference plane, when the stage is in the reference plane; a rotational error detecting device for detecting a relative rotational error of the straight portion of the substrate with respect to a reference direction on the basis of electric signals, said detecting device having irradiation elements each of which irradiates a beam of light to the straight portion of the substrate held by the holding member and an optical detecting elements each of which optically detects the beam of light on the opposite side from the irradiation device with respect to the substrate and outputs said electric signal; and a rotary drive device for rotating one of the substrates and holders.

A further positioning apparatus for a substrate according to the present invention includes a stage two dimensionally movable in a predetermined reference plane; a holder for holding a substrate having a straight portion on at least a part of the periphery thereof; a holding member for holding the substrate above the stage in a parallel relationship with respect to the reference plane, when the stage is in the reference plane; a rotational error detecting device for detecting a relative rotational error of the straight portion of the substrate with respect to a reference direction on the basis of electric signals, said detecting device having irradiation elements each of which irradiates a beam of light to the straight portion of the substrate held by the holding member and an optical detecting elements each of which optically detects the beam of light on the opposite side from the irradiation device with respect to the substrate and outputs said electric signal, one of said irradiation elements and optical detecting elements being disposed on the holder; and a rotary drive device for rotating the holder by a value corresponding to the rotational error between a position of the holder in the direction of rotation and a neutral position, whereby the substrate is mounted on the holder so that the straight portion of the substrate held on the holder becomes substantially parallel with the predetermined reference direction when the position of the holder in the direction of rotation is in the predetermined neutral position.

In one embodiment of the above positioning apparatus, the optical detecting elements of the apparatus may be disposed on the holder, and the rotary drive device may include a controller controlling rotation of the holder so that the electric signals from the optical detecting elements become predetermined reference values, respectively.

A further positioning apparatus for a substrate according to the present invention includes a stage two dimensionally movable in a predetermined reference plane; a holder for holding a substrate having a straight portion on at least a part of the periphery thereof; a holding member for holding the substrate above the stage in a parallel relationship with respect to the reference plane, when the stage is in the reference plane; a rotational error detecting device for detecting a relative rotational error of the straight portion of the substrate with respect to a reference direction on the basis of electric signals, said detecting device having irradiation elements each of which irradiates a beam of light to the straight portion of the substrate held by the holding member and an optical detecting elements each of which optically detects the beam of light on the opposite side from the irradiation device with respect to the substrate and outputs said electric signal, one of said irradiation elements and optical detecting elements being disposed on the holder; and a rotary drive device for rotating the substrate so that the rotational error becomes zero, whereby the substrate is mounted on the holder so that the straight portion of the substrate becomes substantially parallel with the predetermined reference direction.

In another embodiment of the above positioning apparatus, the optical detecting elements of the apparatus may be disposed on the holder, and the substrate rotary drive device may include a controller for controlling the rotation of the holder so that the photoelectric signals from the photoelectric detecting elements become predetermined reference values, respectively.

According to the present invention, the substrate is held above the stage disposed in a predetermined position (transfer position) before the substrate is mounted on the holder and the rotation error or angular offset of the straight portion (flat) of the substrate with respect to the reference direction (or reference line) is detected by the rotation error detecting device. The substrate is mounted on the holder after the rotary drive device rotates, for example, the holder from the neutral position by a value corresponding to the rotation error. Then it is possible to position the substrate on the stage by rotating the holder back to the neutral position so that the direction of the straight portion of the substrate and the reference direction become substantially parallel.

DETAILED DESCRIPTION OF THE PREFERRED EMBODIMENTS

Figure 1:
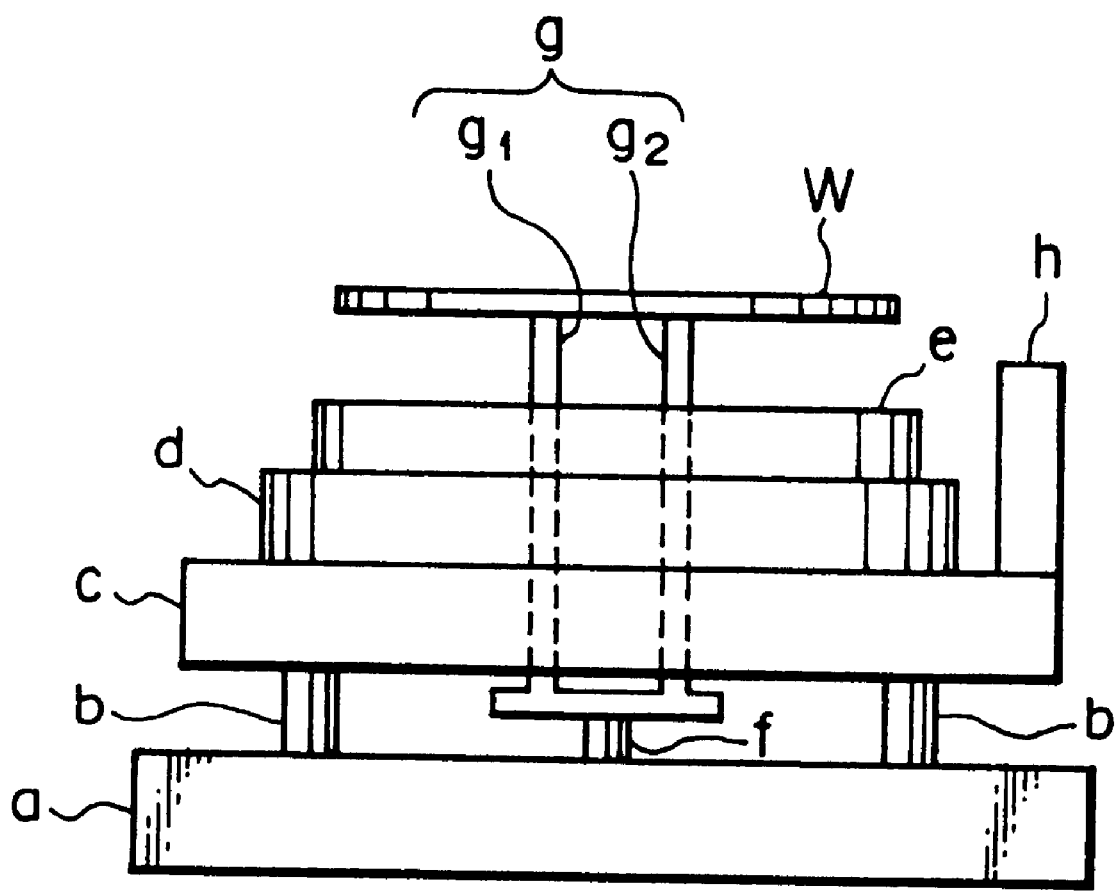
FIG. 1 is a view showing a wafer transfer mechanism used in a conventional projection exposure apparatus.

Referring to the drawings embodiments of the positioning method according to the present invention will be explained hereinafter. This example is applied to a case where a wafer is exchanged in a stepper type projection exposure apparatus in which a pattern on a reticle is transferred onto each shot area on a wafer through an optical projection system.

Figure 2A:
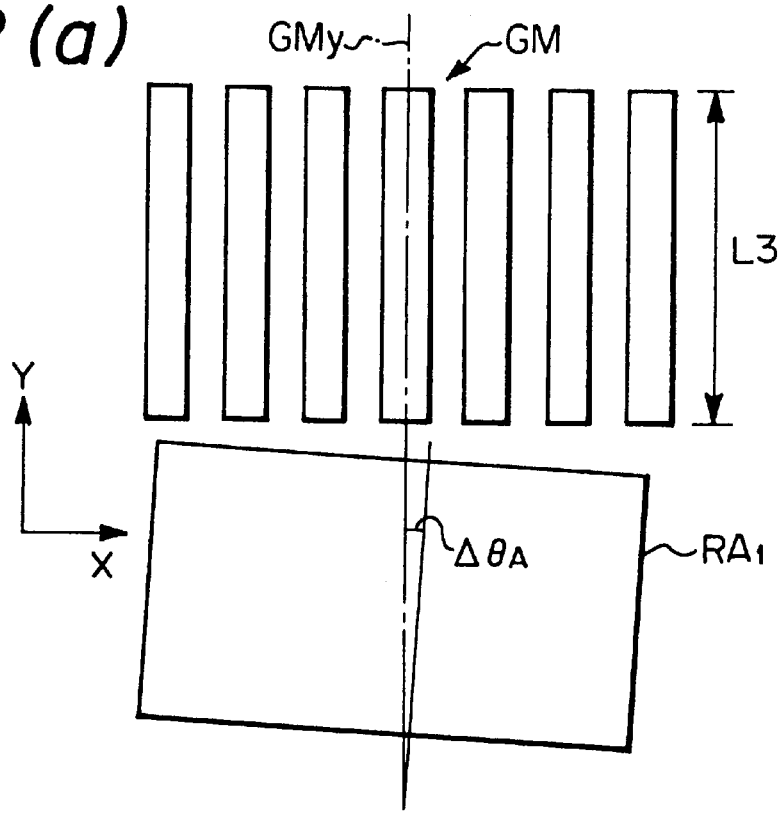
FIG. 2(a) is a view showing an inclination between an LIA mark for alignment and a beam in a conventional projection exposure apparatus.
Figure 2B:
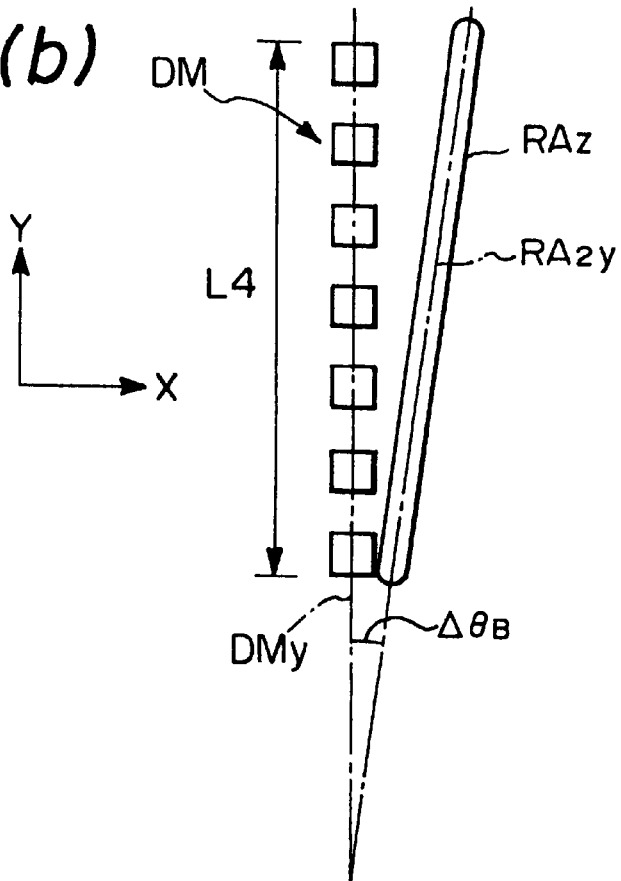
FIG. 2(b) is a view showing an inclination between an LSA mark for alignment and a beam.
Figure 4:
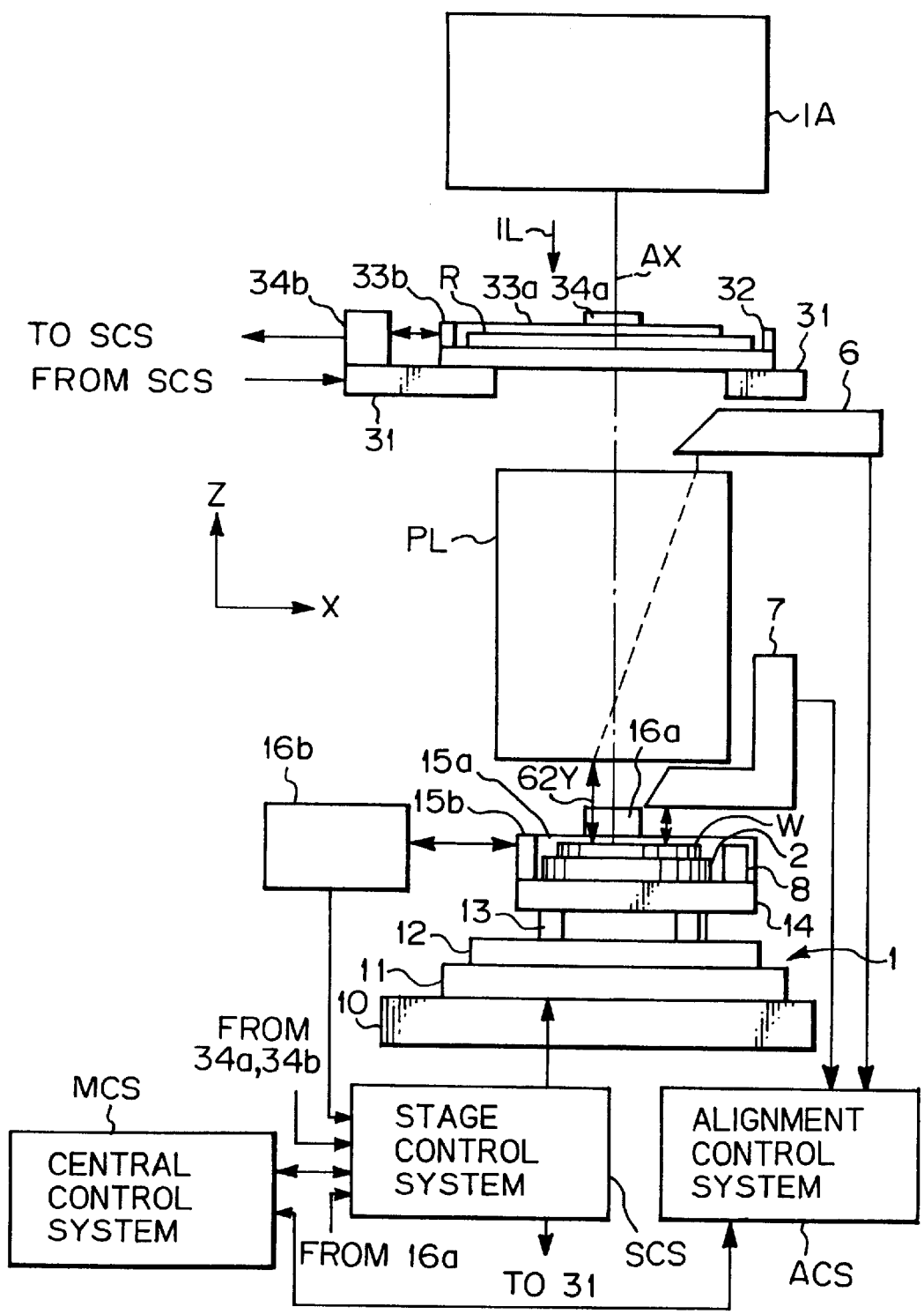
FIG. 4 is a side view showing a schematic structure of one example of a projection exposure apparatus for carrying out the positioning method explained in FIGS. 3(a) to 3(c).

FIG. 4 shows a schematic side structural view structure of a projection exposure apparatus for carrying out the positioning method of this embodiment. Referring to FIG. 4, a pattern on a reticle R is projected onto each shot area on a wafer W to expose the shot area with an illumination light IL from an illumination optical system IA including a light source comprising a mercury vapor light, fly-eye lens, condenser lens and the like. In FIG. 4, it is assumed that the Z-axis is taken such that it is parallel to an optical axis AX of the optical projection system and the Y-axis is taken such that it is perpendicular to the paper of FIG. 2 in a plane perpendicular to the Z-axis, and the X-axis is taken such that it is parallel to the surface of the paper of FIG. 2.

The reticle R is held on a reticle stage 32 disposed on a reticle table 31. The reticle stage 32 can move translationally and rotate in θ direction (rotational direction) in an X-Y plane by a reticle drive system (not shown). Movable mirrors 33a and 33b are respectively disposed on end edges of the reticle stage 32 which extend in an X direction a Y direction, respectively. The position of the reticle stage both in the X and Y directions is continually detected with, for example, a resolving power in a order of 0.01 μm by means of the movable mirrors and laser interferometers 34a and 34b fixed to the reticle base 31. At the same time an angle of rotation of the reticle stage 32 is also detected. Measured values detected by the laser interferometers 34a and 34b are transferred to a stage control system SCS which controls a reticle drive system disposed on the reticle base on the basis of information thereof. Information regarding measured values detected by laser interferometers 34a and 34b is applied from the stage control system to a central control system MCS which controls the stage control system SCS on the basis of the information.

On the other hand, the wafer W is held by vacuum suction on a wafer holder 2 disposed on a sample table 14 on a wafer X-stage 12. The sample table 14 is held by a Z tilt driver (in this example, it is constituted by three members movable in Z direction, respectively) which corrects the position of the wafer W in a direction parallel to and extending along the optical axis AX (Z direction) and tilt (inclination) of the wafer. The Z tilt driver 13 is disposed on the X-stage 12. The X-stage 12 is mounted on a wafer Y-stage 11 which is mounted on the wafer base 10. The X-stage and the Y-stage are constructed such that they can move in the X direction and the Y direction, respectively, by means of a wafer stage drive system (not shown). There is mounted on an edge portion of the sample table 14 a movable mirror 15b. The coordinate of the X direction and the angle of rotation of the sample table 14 are detected by means of the movable mirror 15b and a laser interferometer 16b positioned face to face with the movable mirror 15b. There is also mounted on the outer edge portion of the sample table 14 the other movable mirror 15a. The coordinate of the Y direction of the sample table 14 is detected by means of the movable mirror 15a and a laser interferometer 16a positioned face to face with the movable mirror 14a. The coordinate system which is defined by coordinates (X, Y) measured by means of the laser interferometers 16a and 16b is referred to herein as a wafer stage coordinate system (X, Y).

Values measured by the laser interferometers 16a and 16b are supplied to a stage control system SCS which controls a wafer stage driving system based on information supplied from the laser interferometers. Information regarding measurement values measured by interferometers 34a and 34b are supplied from the stage control system SCS to a central control system which controls the stage control system based on the information. A wafer carrier device 40 (FIGS. 5(a), 5(b)) for transferring the wafer is provided adjacent to the wafer stage and a wafer transfer mechanism is provided in the wafer stage. Details of the carrier device and mechanism will be explained in detail hereinafter.

Moreover, the projection exposure apparatus according to this embodiment is provided with an alignment sensor 6, FIG. 4, of a TTL and LSA (Laser Step Alignment) type for aligning the reticle R and the wafer W and an alignment sensor 7 on an Off-Axis and FIA (image pick-up type) type. The alignment sensor 6 has another alignment sensor of an LIA (Laser Interferometric Alignment) type incorporated therein in parallel therewith. A case wherein the LSA type alignment sensor LSA is used will be explained thereinafter. When alignment is carried out, the position of the wafer mark formed on the wafer W is detected by either one of the alignment sensors 6 and 7, and the pattern formed in each shot area of the wafer W at previous steps is precisely aligned with the pattern on the reticle based on the detected results. The detection signals from the alignment sensors 6 and 7 are processed by an alignment control system ACS which is controlled by the central control system MCS. A reference mark member 8 is fixed to the sample table 14 such that the surface thereof is the same level with the surface of the wafer W and has a mark formed on the surface thereof which becomes a reference or standard for alignment.

As described above, the stage control system SCS and the alignment control system ACS are controlled by the central control system MCS. The central control system MCS generally controls the entire projection exposure apparatus to carry out an exposure operation with a predetermined sequence.

Next, referring to FIGS. 5(a) and 5(b), a wafer carrier system and a wafer transfer mechanism for transferring the wafer to the wafer stage will be explained hereinafter. In this description, "Wafer stage" is a general term for the sample table 14, the Z-tilt driver 13, the X-stage 12, the Y-stage 11 and the wafer base 10 as a whole and as shown is FIG.4.

Figure 5A:
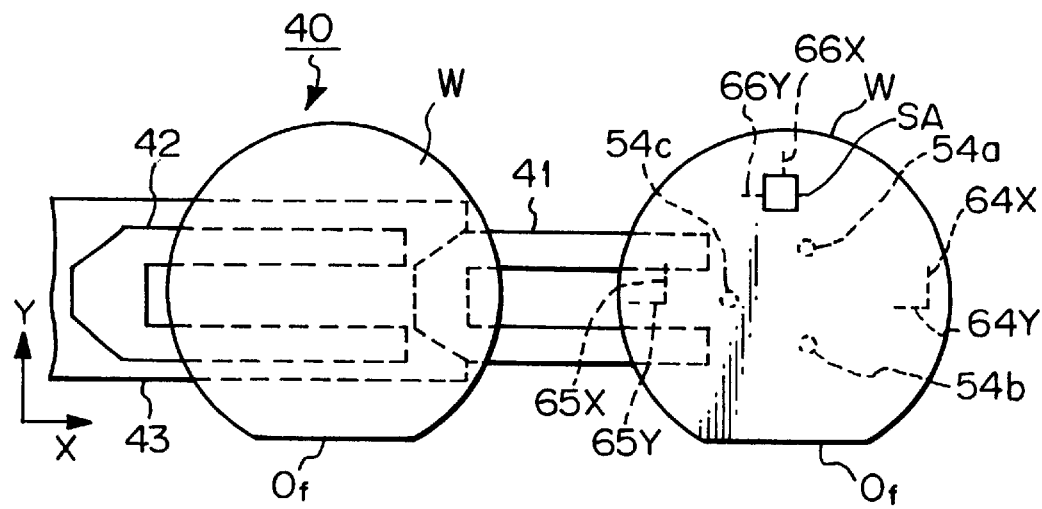
FIG. 5(a) is a top plan view showing a wafer carrier mechanism and a wafer transfer mechanism both used in the projection exposure apparatus shown in FIG. 4.
Figure 5B:
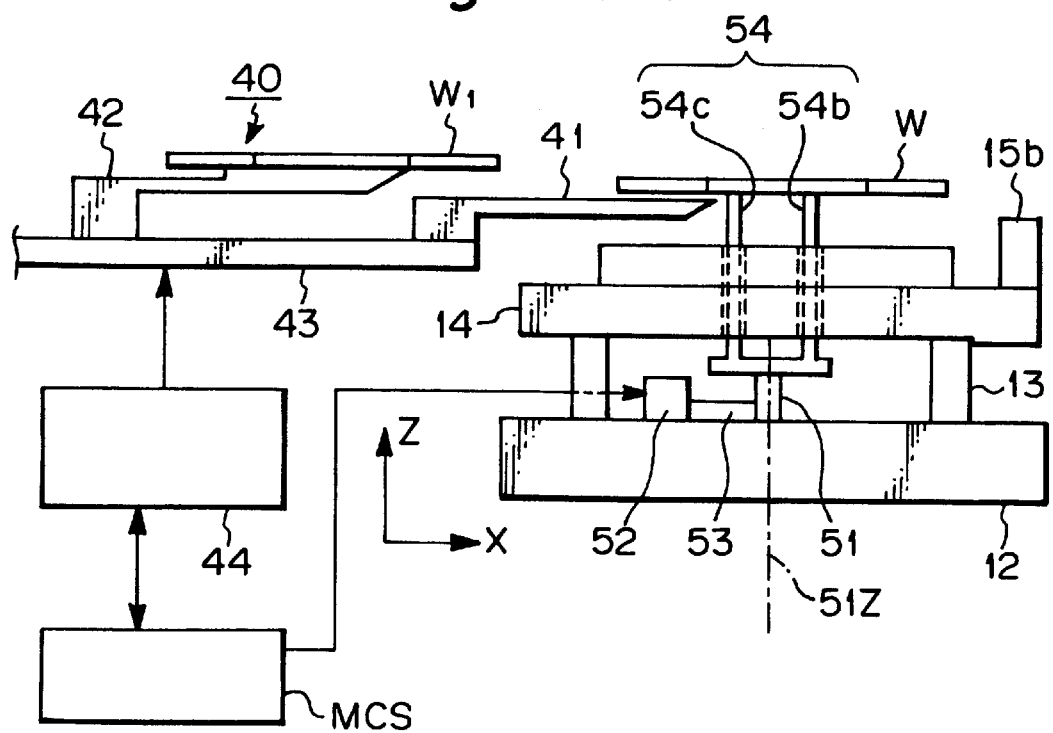
FIG. 5(b) is side view of the transfer mechanism shown in FIG. 5(a).

FIG. 5(a) is a plane view showing a structure around the wafer carrier system and the wafer stage in this embodiment and FIG. 5(b) is a side view showing the structure. In FIGS. 5(a) and 5(b), a wafer carrier device 40 for transferring the wafer is disposed above a place which is situated in -X side (in FIGS. 5(a) and 5(b) in the left side) on the wafer stage. The wafer carrier device 40 is composed of carrier arms 41 and 42 which are arranged in series in the X direction, a slider for sliding these carrier arms 41 and 42 to a predetermined position and an arm drive system (not shown) for driving the carrier arms 41 and 42. Each of the two carrier arms 41 and 42 has a U-shaped flat plate portion upon which the wafer is placed. Using the two carrier arms the exposed wafer is unloaded from the wafer stage and a next wafer is loaded onto the wafer stage. The wafer carrier device has a well known structure and therefore, a detailed explanation thereof will be omitted.

The carrier arms 41 and 42 move along a slider to a loading position where the wafer is transferred to a wafer stage system on the basis of a command from a loader control device 44 to take out a preceding wafer $W_1$ which has already been exposed. A succeeding wafer W to be next exposed is moved to above the wafer stage by means of the carrier arm 41 and placed on an elevating or vertically movable table 54. FIGS. 5(a) and 5(b) show a state in which the preceding wafer $W_1$ is placed on the carrier arm 42 and the wafer W to be next exposed is transferred from the carrier arm 41 to the elevating or vertically movable base 54.

The elevating base or pedestal 54 is supported by means of a telescopic or expansible mechanism 51 mounted on the X-stage 11 and has three supporting pins 54a, (not shown 54b and 54c each of which is loosely received and extends through respective openings formed in the sample table and the wafer holder 2, FIG. 4. These supporting pins 54a~54c move the wafer W up and down by the movement of the telescopic mechanism 51 in vertical direction (Z direction) to perform transfer of the wafer. Each of the three supporting pins 54a~54c has a suction hole formed at an upper tip end thereof to suck the wafer by vacuum. The tip ends of the supporting pins are moved to the level at which the wafer is transferred between the tip ends of the supporting pins 54a–54c and the carrier arms 41 and 42 when transfer of the wafer is being carried out. When the wafer is placed on the wafer holder 2, FIG. 4, the tip end is moved to a position lower than the surface of the wafer holder 2. Movement or displacement of the wafer W relative to the supporting pins 54a~54c when the elevating base is moved up and down is prevented by holding the wafer by vacuum suction at the tip end of pins 54a–54c.

The telescopic or expansible mechanism 51 is supported on the X-Y plane and is rotatable about a central axis 51Z of the telescopic mechanism. The telescopic mechanism 51 engages with a drive shaft 53 which is rotated by a rotary drive system 52 provided on the X stage and can rotate by a predetermined angle by a command from the central control system MCS which controls the rotary drive system 52. The rotary system consisting of the rotary drive system 52, the drive shaft 53 and the telescopic mechanism 51, FIG. 5(b) and has a sufficient resolving power and can control rotation of the wafer with an accuracy in the order of 0.1 mrad. The telescopic mechanism 51, the rotary drive system 52 and the drive shaft constitute a drive mechanism for the elevating or vertically movable base.

Figure 3A:
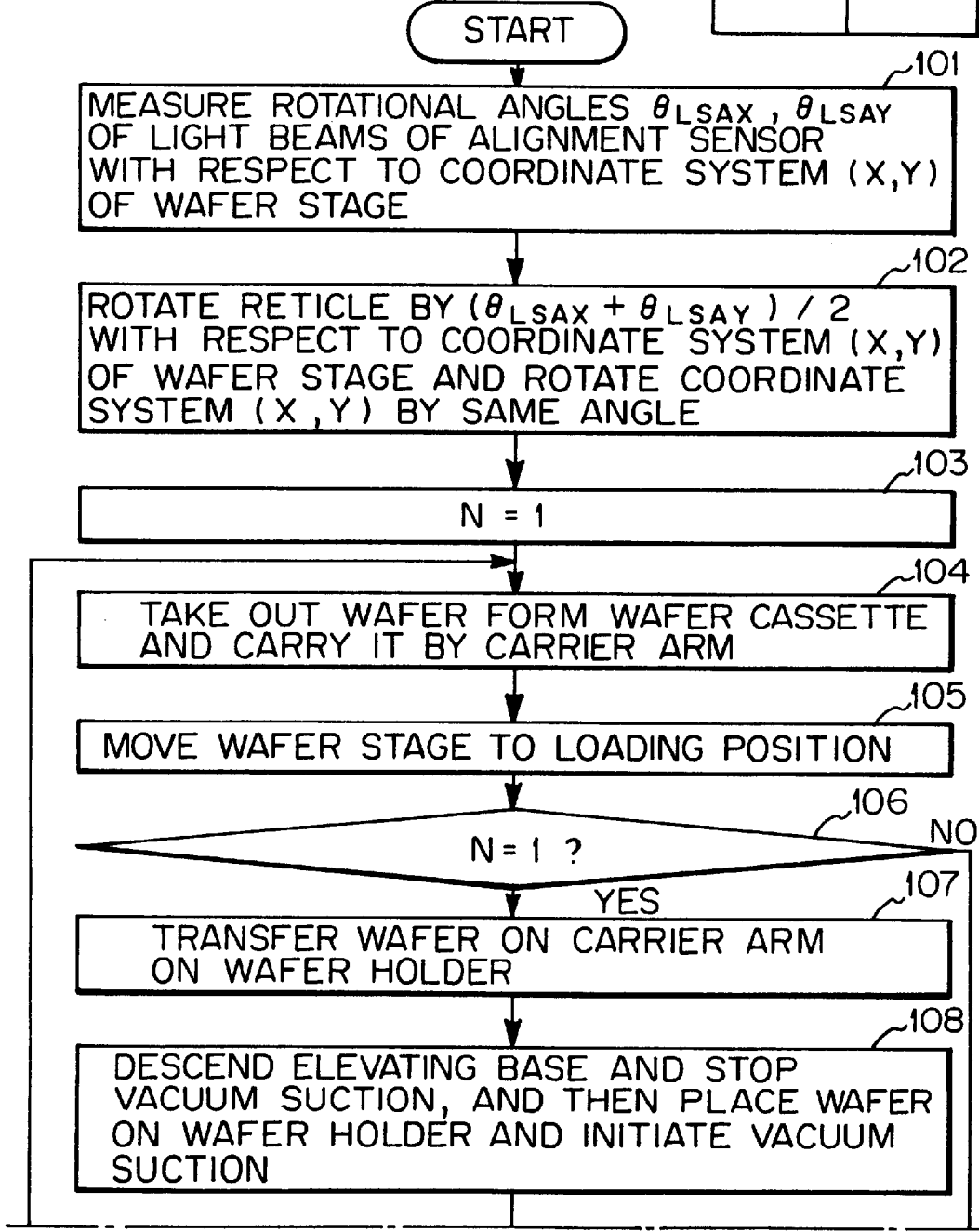
FIG. 3 is a flow chart explaining relationship among FIGS. 3(a), 3(b) and 3(c) and FIGS. 3(a) to 3(c) explaining one embodiment of the positioning method according to the present invention.

One example of positioning operation of the projection exposure apparatus of this embodiment will be explained hereinafter with reference to FIGS. 3(a) to 3(c).

Figure 6A:
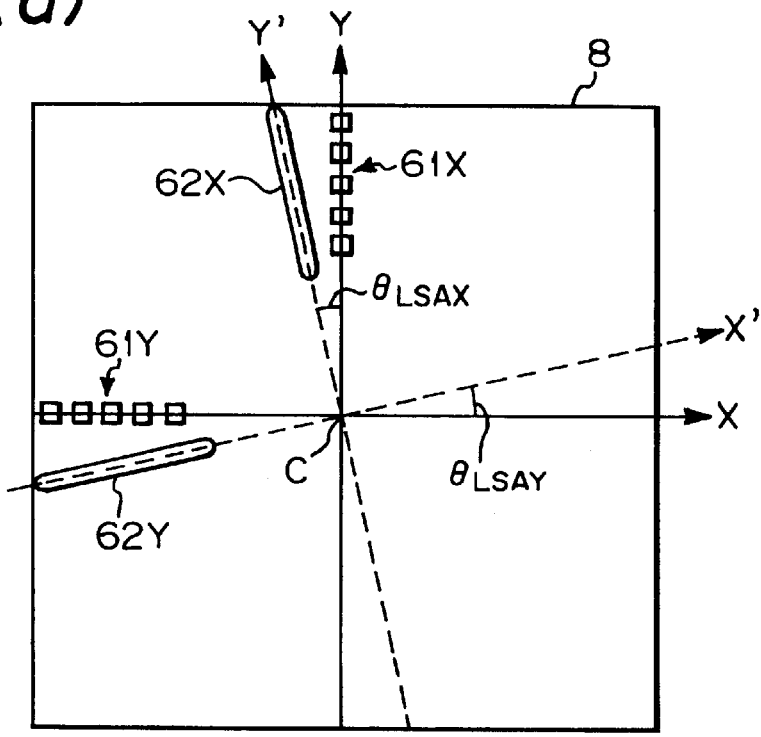
FIG. 6(a) is a view showing a rotational error of a reference mark formed on a reference mark member on a substrate stage shown in FIGS. 3(a) to 3(c) relative to a band-shaped laser beam projected onto the reference mark member.
Figure 6B:
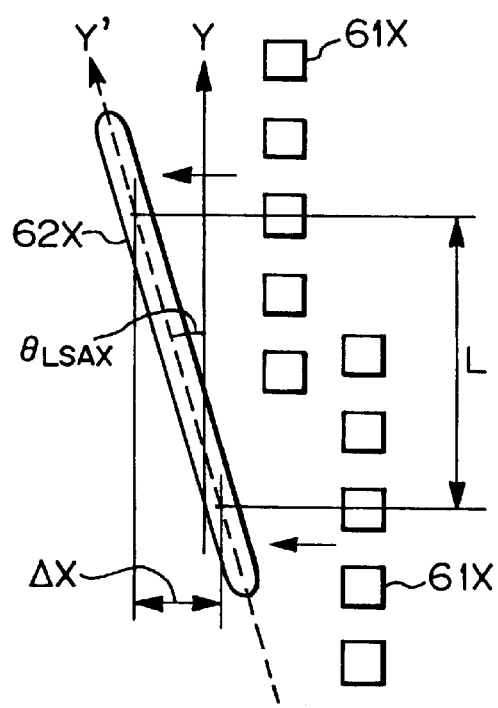
FIG. 6(b) is a view explaining a method for calculating the rotational error.

According to the present invention, at first in Step 101, an inclination of a laser beam from the alignment sensor 6 relative to the coordinate system (X,Y) of the wafer stage is obtained by using the reference mark on the reference mark member 8 shown in FIG. 4. Referring to FIGS. 6(a) and 6(b), an example of calculating a state of inclination and an inclined angle between a band-shaped (slit-shaped) laser beam spot which is projected from the alignment sensor 6 of the LSA type onto the reference mark member 8 with respect to the coordinate system (X,Y) of the wafer stage, will be explained. In this case, the alignment sensor 6 is used for the Y axis, but another laser beam is also irradiated from another LSA type alignment sensor (not shown) for X axis to the reference mark member 8. Incidentally, the above matter is also true of the LIA type alignment sensor.

FIG. 6(a) shows a state in which a laser beam is irradiated from the alignment sensor 6 onto the reference mark member 8 and FIG. 6(b) shows a diagram explaining a method for calculating the angle of inclination of the laser beam. In FIG. 6(a), the dotted-line-shaped reference marks 61Y and 61X which are parallel with the X axis and Y axis, respectively, are formed on the X-Y coordinate system which has an origin thereof at the center point of the reference mark member. On the other hand, if it is assumed that coordinate having coordinate axes parallel to longitudinal axes of the laser beams 62Y and 62X, respectively, is an X'-Y' coordinate, inclined with respect to the X-Y coordinate of the wafer stage by angles $\theta_{LSAY}$ and $\theta_{LSAX}$, respectively. The laser beams 62Y and 62X are used for detecting the positions in Y and X directions for alignment.

At first, in order to detect the rotational or angular error $\theta_{LSAX}$, the wafer stage is stepped in the Y direction by L, for example, as shown in FIG. 6(b) and the laser beam 62X is scanned by the reference mark 61X to detect the position of the reference mark 61X. Since the Y coordinate axis of the wafer of stage is inclined with respect to the Y'0 coordinate axis of the band-shaped laser beam 62X, X coordinate value of the reference mark 61X when the band-shaped laser beams are scanned at different positions which are separated in the Y direction by a distance L changes. If it is assumed that the X coordinate values which are measured at two positions of the reference mask 61 are $x_1$ and $x_2$, respectively, the rotational or angular error $\theta_{LSAX}$ is obtained as $\Delta x/L$, wherein $\Delta x$ is equal to $(x_1-x_2)$ (i.e., $x_1-x_2=\Delta x$). The rotational or angular error $\Delta_{LIAY}$ of the X' coordinate axis with respect to the X coordinate axis can be measured in the same manner. Rotational or angular errors $\Delta_{LIAX}$ and $\Delta_{LIAY}$ of the laser beam with respect to the alignment mark of the LIA type can also be obtained in the same manner.

The values of the rotational errors of the laser beams with respect to the alignment sensors of the LSA and LIA types are stored in the central control system MCS. It is assumed that a pre-alignment mechanism (not shown) is adjusted so that there is no rotational or angular error between the pre-alignment mechanism and the coordinate system (X, Y) of the wafer stage. The pre-alignment mechanism can pre-align each wafer to the order of 50 μm (3σ) by detecting an orientation flat (flattened portion) Of formed on the periphery of the wafer W, before the wafer is transferred from a wafer cassette (not shown) to the carrier arms 41 and 42.

Under this condition, assuming that the alignment sensor 6 of the LSA type is used in Step 102, the reticle R is rotated with respect to the coordinate system (X, Y) of the wafer stage by a value $(\theta_{LSAX}+\theta_{LSAY})/2$ which is a mean value of the rotational or angular errors (around the center point C in FIG. 6(a)) $\theta_{LSAX}$ and $\theta_{LSAY}$. Next, a coordinate system which is obtained by rotating the coordinate system (X, Y) by the angle $(\theta_{LSAX}+\theta_{LSAY})/2$ is assumed to be a stage coordinate system. Hereinafter the wafer stage is driven on the basis of this stage coordinate. In Step 103, a variable N expressing the order of the wafers is set as 1 (one). It is assumed that the number of the wafers in one lot is M. Next in Step 104, one of wafers W is taken out from a wafer cassette (not shown) and then the wafer W is transferred by means of the carrier arm 41 after it is positioned within a positioning error of the order of 50 μm by a known pre-alignment mechanism (not shown). Thereafter, in Step 105, the wafer stage is moved to a loading position (a wafer transfer position), and in Step 106, whether the variable N is 1 (one) or not is determined. If the variable is 1 the operation advances to Step 107. If the variable is not 1 the operation advances to Step 119.

In Step 107, the wafer W on the carrier arm 41 is transferred onto the wafer holder 2. Next in Step 108, the wafer is transferred onto elevating or vertically movable base 54 and after transfer of the wafer is finished the carrier arm 41 is retracted and then the elevating base is moved downwardly. After the wafer is placed on the elevating base, the elevating base is rotated by the mean value $(\theta_{LSAX}+\theta_{LSAY})/2$ of angles of inclination of the alignment laser beams obtained in Step 101, by operating the rotary driving system 52. This correction of the rotational error is carried out for all the wafers in the lot. At the time when the wafer reaches the wafer holder 2, suction by the elevating base is stopped and suction by the wafer holder 2 is initiated so that the wafer W is held on the wafer holder 2. In this case, as shown in FIG. 5(a), alignment marks 65X, 65Y and 64X, 64Y of the LSA type for alignment are formed in the right and left sides of the wafer W. Also, in each of shot areas SA in the wafer W alignment marks 66X and 66Y of the LSA type for final alignment are formed.

Next in Step 109, the wafer stage is driven and the alignment marks 64X, 64Y and 65X, 65Y of the LSA type are measured by means of the LSA type alignment sensor 6 and an alignment sensor (not shown) for the X axis. In this case, for example, if the coordinate values on the Y axis of the stage coordinate system, which is obtained as results of measurement of the two alignment marks 65Y and 64Y on the opposite ends of the wafer, are $y_3$ and $y_4$, the rotational or angular error of the wafer W with respect to the stage coordinate system can be obtained from these coordinate values and the distance between the two reference masks 65Y and 64Y, as $(y_4-y_3)/LY$. This value is defined as a rotational error $\Delta\theta_1$ (if the wafer is the Nth one, the rotational error is $\Delta\theta_N$). By doing as described above, a rough measurement of rotational error is performed.

Next in Step 110, it is assumed that Nth wafer is being loaded now and the angular which has been corrected by the elevating base 49 is $\theta_T$. When the variable N is 1, $\Delta_T$ is equal to $(\Delta_{LSAX}+\Delta_{LSAY})/2$ (i.e., $\theta_T=(\theta_{LSAX}+\theta_{LSAY})$). Also it is assumed that sum of the rotational error $\Delta\theta_N$ and the corrected angle $\theta_T$ is an absolute rotational or angular error $\Theta_N$. The next equation is realized.

$$\Theta_N=\theta_T+\Delta\theta_N$$

Next, a new average rotational or angular error $\theta_T(=(\Theta_1+\Theta_2+\ldots+\Theta_N)/N)$ which is an average value of the absolute rotational error $\Theta_N$ from the first wafer to Nth wafer is obtained. In Step 111, whether or not the rotational error $\Delta\theta_N$ is within an allowable error range is determined. This allowable error range is inputted by, for example, an operator, but it is a value which is determined by an allowable value of an inclination of the laser beam from the alignment sensor 6. If the rotational error $\Delta\theta_N$ is within the allowable error range the operation enters Step 115 and if it is outside the allowable error range the operation enters Step 112.

In Step 112, suction operation by the wafer holder 2 is stopped and suction operation by the elevating base 54 is initiated to hold up the wafer. In Step 113, the wafer is rotated by the rotation of the elevating base 54 so that the rotational error $\Delta\theta_N$ is corrected. In Step 114, the elevating base 54 is descended and the suction operation thereof is stopped to place again the wafer on the wafer holder 2. The suction operation by the wafer holder is initiated to fixedly hold the wafer. Next, the operation enter Step 115.

In Step 115, a high precision measurement (a fine measurement) of the rotational error of the wafer for the stage coordinate system is carried out by the alignment sensor 6. In this case, for example, the rotational or angular error is obtained by statistically processing the positions of the wafer marks provided for a plurality of shot areas formed on the wafer. Therefore, a more precise rotational error is obtained in comparison with the measurement result in Step 109. It is assumed that the rotational error (remaining error) for the stage coordinate system of the wafer obtained by the above fine measurement is $\Delta\theta'$. In Step 116, the stage 32 is driven to rotate the reticle R by the rotational error $\Delta\theta'$ based on the above results. Thus the rotational error of each shot area of the wafer with respect to the reticle pattern is removed. The other errors are removed by correcting the position of the wafer stage and the exposure of the wafer is performed successively.

After exposure of one wafer is finished, in Step 117, the variable N representing the order of the wafer is added by one and the operation enter Step 118 under the condition of N=2. In Step 118, whether or not N is equal to M (N=M) is determined. If N is not equal to M (N≠M) the sequence beginning at Step 104 is repeated again and if N is equal to M (N=M) the operation finishes.

Next, a sequence in which the variable N is not 1 in Step 106 will be explained hereinafter. If the variable N is not 1 the operation enters Step 119 as explained hereinbefore. Since a preceding wafer is placed on the wafer holder, it is changed with a succeeding wafer. In Step 119, the wafer holder 2 stops a suction operation thereof and the elevating base 54 initiates the suction operation to hold the wafer by vacuum suction and elevates the wafer. Next, in Step 120, the wafer is placed on a carrier arm (carrier arm 42) for transfer and the wafer placed on the other carrier arm (carrier arm 41) for transfer is moved to a position over the wafer holder 2 and thereafter, the wafer is transferred to the elevating base.

Next in Step 121, suction operation by the elevating base 54 is initiated to hold the wafer thereon and thereafter, the wafer is rotated by a rotation of the elevating base 54 so as to correct an average rotational error $\theta_T$, whereby rotational error of the wafer is corrected. After correction of the rotational error finished, in Step 122, the elevating base 54 is descended and suction operation thereof is stopped. Thereafter, the wafer is placed on the wafer holder 2 again and is fixedly held on the wafer holder 2 by the suction of the wafer holder. The operation enters Step 109 and calculation of the rotational or angular error is carried out.

As explained above, if the variable N is not 1 the average rotational error $\theta_T$ has already been obtained since the measurement of the preceding wafer has already finished. Generally, the rotational error of the wafer is determined by a matching error between the wafer and the exposure apparatus in a process of forming an alignment mark on the wafer and a pre-alignment error. Therefore, the chance that the rotational error of fixed value has been created in the same lot is high. For this reason, as a method of estimating the rotational error to be corrected in advance, there is a method of obtaining an average value (average rotational error) $\theta_T$ of the absolute rotational errors $\Theta_1, \Theta_2, \ldots \Theta_N$ created up to that time, as illustrated in Step 110.

Before the rotational error of the wafer is measured in Step 109 by the alignment sensor, it has been corrected in advance in Step 121. Therefore, the probability that the wafer is placed again as in Steps 119 to 122 after it is placed on the wafer holder 2 is reduced. The sequence operation of this is shown in Steps 119 to 122, and if the number of wafer is increased the reliability of the average rotational error $\theta_T$ increases resulting in reduction of frequency of operation entering Steps 112 to 114. Because of this series of the sequence, the rotational error due to the inclination of a laser beam of the alignment sensor is decreased and the wafer is exposed with a higher throughput (productivity).

As explained above, according to the above embodiment a creation of the rotational error due to the inclination between the alignment mark, and wafer mark on the wafer and the laser beam is prohibited since the angle of rotation of the wafer W and the reticle R is determined on the basis of the direction of the laser beam of the alignment sensor 6. Since the angle of rotation of the wafer W is determined according to the inclination of the laser beam, it is not necessary to mechanically and optically adjust the inclination of the laser beam with the angle of rotation of the wafer with high accuracy to reduce manufacturing cost. In addition, since the elevating or vertically movable base 54 on the X stage 12 can rotate to correct the rotational error, reduction in weight of the sample table 14 and an increase of rigidity of the wafer stage can be attained. Accordingly, in the stepping operation of the wafer stage an accuracy of stability of the wafer stage is increased and a stabilizing time thereof is reduced.

Moreover, according to the system of measuring a rotational error of this embodiment, an assumed rotational error of the wafer is determined not by a result of measurement of one wafer but by the average rotational error or angular error $\theta_T$ which is obtained by averaging the rotational errors of a plurality of the wafers. Therefore, correction of rotation of the wafer on the wafer stage by using a rotating function of the elevating base 54 is reduced and throughput (productivity) of the projection exposure apparatus is increased. Also, since correction of the rotational error is performed at the same time as descending the elevating base 54 and the remaining error (rotational error $\Delta\theta'$) is corrected by means of the reticle stage 32, the throughput is improved.

According to the conventional method shown in FIG. 1, for example, the rotation of the wafer is corrected by means of the θ-rotational correction mechanism d for the wafer disposed on the sample table c after the rotational error is measured through a rough alignment. Time required to perform this correction is one to two seconds while according to the present invention such a time is not required, because the correction of rotation of the wafer is performed beforehand so that it is within the allowable error while descending the elevating base 54. In order to place several wafers on the wafer holder again at the beginning of a lot, several times are required. However, according to learning effects, if the number of wafers is increased, the frequency to re-place (place again) the wafer and the time required to re-place the wafer are reduced. This increases advantages of the present invention.

The conventional projection exposure apparatus shown in FIG. 1 includes the θ rotation correction mechanism d for the wafer between the sample table c upon which the movable mirror h is disposed and the wafer W as a drive system. However, in the present embodiment there is no drive system between the movable mirror h and the wafer W. Therefore, stability in stepping accuracy is increased.

It should be understood that the present invention is applicable not only to a step-and-repeat type exposure apparatus but also to a step-and-scan type exposure apparatus.

Figure 7:
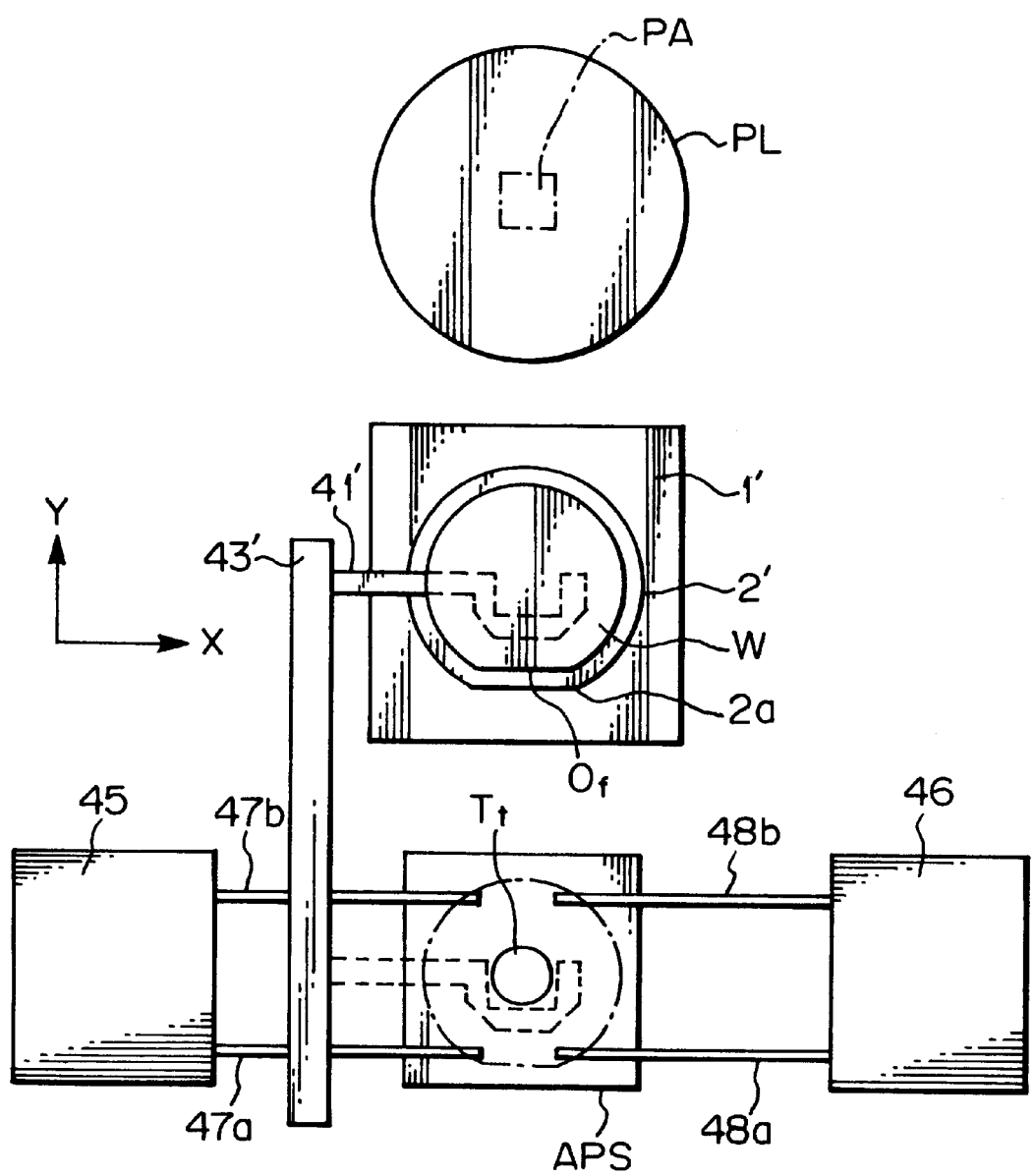
FIG. 7 is a top plan view showing a schematic structure of a wafer carrier system in a projection exposure apparatus to which one embodiment of the present invention is applied.

FIG. 7 is a top plane view showing a schematic structure of a wafer carrier system in a projection exposure apparatus which is preferable as a modified embodiment of the present invention. FIG. 7 shows a state in which a wafer W is held on a carrier arm 41' above an exposure stage arranged or disposed in a transfer position.

A supply wafer cassette or magazine 45 contains a plurality of wafers which will be exposed later. One of the wafers is carried onto turntable Tt of a rough pre-alignment device PAS by means of carrier belts 47a, 47b. The rough pre-alignment device PAS has a structure substantially the same as that shown in Japanese Patent Laid-Open Publication No. Sho 63-280435 and therefore, operation of the rough pre-alignment device will be briefly explained herein. In the rough pre-alignment device PAS, the turntable Tt is rotated after the wafer W is held on the turntable Tt. A peripheral configuration of the wafer W is then photoelectrically detected by a unshown detector or sensor in a non-contact way to detect the position of the wafer and the direction of a straight portion or flat Of on the wafer. Thereafter, the position of the wafer W and the direction of the flat are compensated to a predetermined position and a predetermined direction, respectively. The accuracy of a position compensation by the rough pre-alignment device PAS is relatively rough, and has, for example, a tolerance in the order of ±1.0 mm.

The wafer W the position of which is corrected by the rough pre-alignment device PAS is transferred to a carrier arm 41' which moves along a guide 43' extending in parallel with a Y direction. The carrier arm 41' carries the wafer W above a stage 1' arranged in a transfer position. Thereafter, the wafer W is transferred from the carrier arm 41' to three pins which will be explained hereinafter, and placed on a wafer holder 2' mounted on the stage 1' by a downward movement of the three pins or an upward movement of the wafer holder 2'. At this time, the wafer W is positioned with respect to the wafer holder 2' on the exposure stage 1' by the positioning apparatus according to the present invention as mentioned hereinafter. If the wafer W is held by the wafer holder 2', the exposure stage 1' moves to under an exposure lens PL in order to perform an exposure operation and perform two dimensionally stepping operation relative to a projected image of a circuit pattern formed on a mask (reticle), and then the wafer is repeatedly exposed. After the exposure operation has finished, the wafer W is transferred from the transfer position shown in FIG. 7 to the turntable Tt by means of the carrier arm 41', and thereafter, is carried into a wafer cassette or magazine 46 by means of carrier belts 48a, 48b.

Figures 8A, 8B:
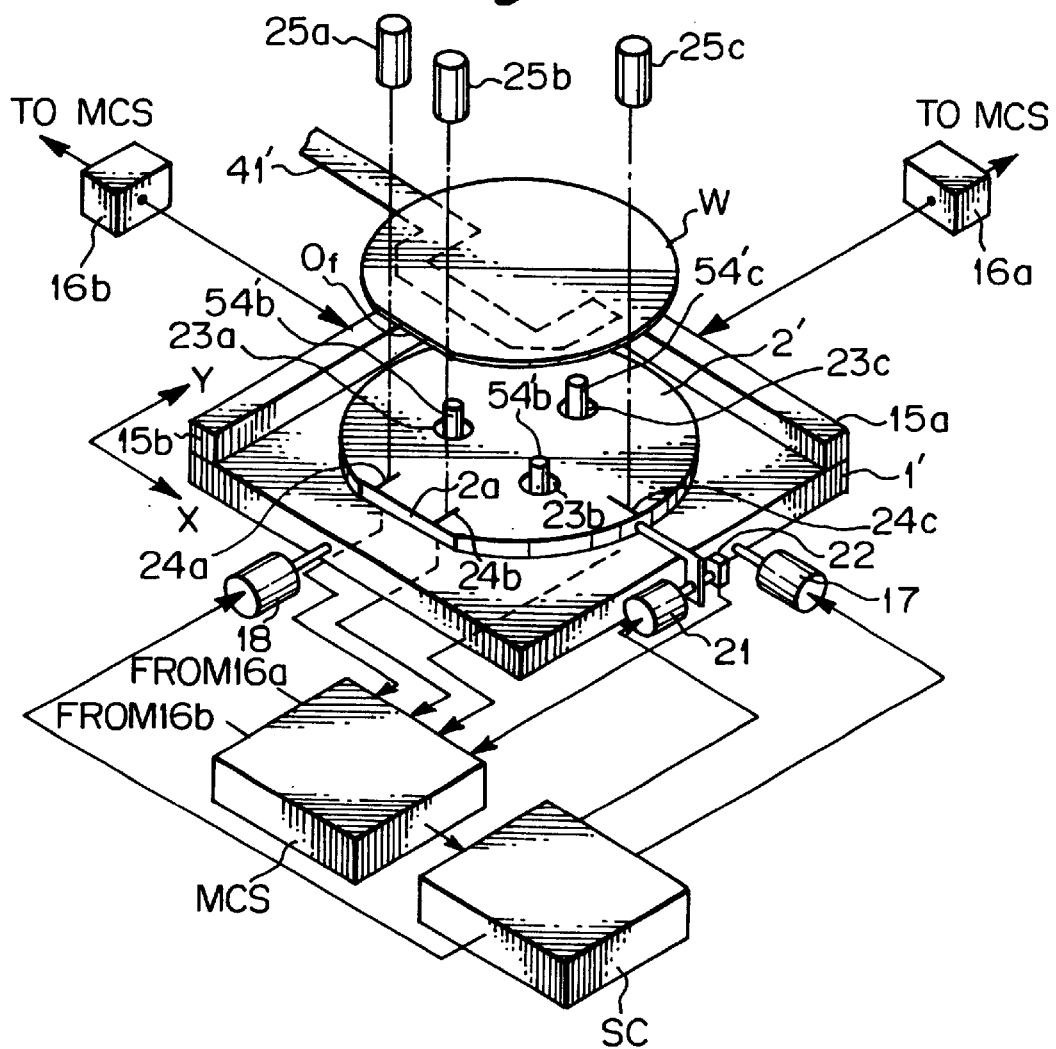
FIG. 8(a) is a perspective view showing a schematic structure of a positioning apparatus for a substrate according to the other embodiment of the present invention.
FIG. 8(b) is an enlarged perspective view showing a relationship between a parallel beam illumination system and a photoelectric sensor of this embodiment.

Referring to FIGS. 8(a) and 8(b) and FIGS. 9(a)–9(c), the positioning apparatus according to another embodiment of the present invention will be explained. FIG. 8(a) is a perspective view showing a schematic structure of a positioning apparatus for a substrate according to the other embodiment of the present invention. This figure shows the state in which the stage 1' is arranged in the transfer position shown in FIG. 7 and the wafer W is held above the stage 1' by means of the carrier arm 41'. The exposure stage 1' is two dimensionally movable in an X-Y plane and upon which the wafer holder for holding the wafer is provided. The exposure stage 1' is driven in the X direction by a X drive device 17 and in the Y direction by a Y drive device 18. The wafer holder 2' is constructed so that it rotates over a small angle (for example, ±1°) within a predetermined range of rotation by a θ drive device 21. These drive devices (17, 18, 21) are controlled by a stage drive control system SC. The holder 2' has a substantially circular configuration as shown in FIGS. 8(a), 8(b) and a straight or flat portion or section 2a formed on the periphery thereof. The direction of the straight portion 2a in the X-Y plane is substantially parallel with the X direction when the wafer holder 2' is in the neutral position.

On the exposure stage 1' are disposed and fixed a reflecting mirror or movable mirror 15b having a reflecting surface which is perpendicular to the X direction and a reflecting mirror or movable mirror 15a having a reflecting surface which is perpendicular to the Y direction. A laser interferometer 16b is structured so that it projects a laser beam to the reflecting mirror 15b and receives the laser beam therefrom to detect the position of the exposure stage 1' in the X direction and a laser interferometer 16a is also structured so that it projects a laser beam to the reflecting mirror 15a and receives the laser beam therefrom to detect the position of the exposure stage 1' in the Y direction. When laser interferometers 16a and 16b detect the position of the exposure stage 1', it outputs detected signals to main control system MCS. On the other hand, an angle of rotation of the wafer holder 2' is detected by a rotation angle detecting system 22. When the rotation angle detecting system 22 detects the angle of rotation of the wafer holder 2', it outputs a detected signal to the main control system. The main control system MCS drives the X drive device 17, the Y drive device 18 and the θ drive device 21 via the stage drive control device SC to control the position of the exposure stage 1' and the rotation of the wafer holder 2'.

There are provided on the exposure stage 1' wafer up and down pins 54a', 54b' and 54c'. The wafer holder 2' is formed with circular openings 23a, 23b and 23c which have such a size that the wafer up and down pins 54a', 54b' and 54c' do not contact with the inner periphery of the openings even when the wafer holder rotates within the range of rotation as described above. There are also provided on the wafer holder 2' three photoelectric detectors or sensors 24a, 24b and 24c. The photoelectric sensors 24a and 24b have longitudinal axes, respectively, which are perpendicular to a straight portion or edge 2a of the wafer holder 2' and are arranged along the straight potion 2a with a space L therebetween. A photoelectric detector or sensor 24c has a longitudinal axis which is parallel to the straight portion or edge 2a and is arranged on the periphery of the wafer holder so that an extension of the longitudinal axis of the photoelectric sensor 24c passes through the center of the rotation of the wafer holder 2'. Moreover, there are provided within the projection exposure apparatus irradiation devices or parallel beam illumination systems 25a, 25b, 25c which irradiate parallel light beams to the photoelectric sensors 24a, 24b and 24c when the exposure stage 1' is in the transfer position. The photoelectric detectors or sensors 24a, 24b and 24c have, as shown in FIG. 8(a), a light receiving surface, respectively, which can detect the light over a predetermined straight range (in FIG. 8(b) over the length $w_1$) extending along a longitudinal direction. On the other hand irradiation devices or parallel beam illumination systems 25a, 25b and 25c are capable of irradiating the parallel light beams R to the light receiving surface (the length thereof is $w_1$) of the photoelectric sensors over an area (a circular area having a diameter d) which is sufficient to cover the light receiving surface even though the wafer holder is rotated within the maximum range. These parallel beam illumination systems 25a, 25b and 25c have, for example, laser diodes as light sources, respectively, and irradiate laser beams having wavelength which does not sensitize the wafer W to the photoelectric sensors, respectively, as parallel beams. On the other hand, the photoelectric sensors 24a, 24b and 24c comprise, for example photodiodes, respectively, and, when receiving the parallel beams of light from the parallel beam illumination systems 25a, 25b and 25c, output photoelectric signals corresponding to the strength of light of received laser beams to the main control system MCS. Now, levels (voltage) of photoelectric signals outputted from the photoelectric sensors or detecting elements 24a, 24b and 24c are S1, S2 and S3, respectively. The main control system MCS controls the movement of the exposure stage 1', the rotation of the wafer holder 2' and the movement of the carrier arm 41', as well as the whole of the apparatus.

Positioning operation of the wafer according to the above embodiment will be explained referring to FIG. 8(a) and FIGS. 9(b) to 9(d). FIGS. 9(a) to 9(d) are figures showing relative positional relation among the wafer W, the exposure stage 1', the wafer holder 2' and the photoelectric sensors 24a, 24b and 24c disposed on the wafer holder 2' and show a process for positioning the wafer W with respect to the wafer holder 2' (the exposure stage 1').

Figure 9A:
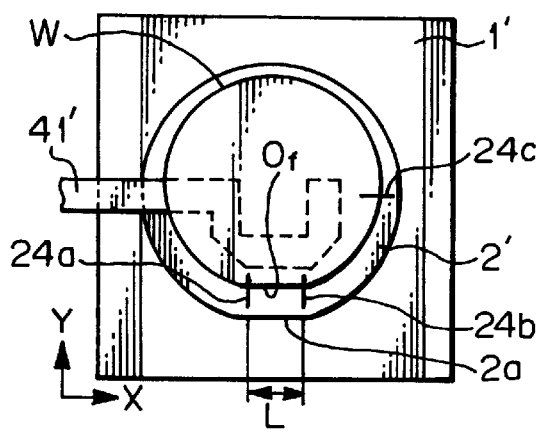
FIG. 9(a) is a top plane view showing a state in which a wafer W is placed on a substrate stage.

First of all, the wafer W and the exposure stage 1' are positioned at the transfer position as shown in FIG. 9(a). At this time the wafer holder 2' is in a neutral position and thus the direction of the straight portion or section 2a of the wafer holder 2' is parallel to the X direction. At this time, the wafer W is displaced from the transfer position and the parallelism between the direction of the straight section or flat Of and the X direction becomes disordered because of an accuracy of the position compensation by the rough pre-alignment device PAS or the transfer of the wafer W from the rough pre-alignment device PAS to the carrier arm 41'. Then the main control system MCS makes the parallel beam illumination systems 25a, 25b and 25c irradiate the laser beams and project the three edge portions of the wafer on the light receiving surfaces of photoelectric sensors as shown in FIGS. 8(a) and 8(b). The flat Of of the wafer W is projected on the photoelectric sensors 24a and 24b and an arcuate edge portion of the wafer W is projected on the photoelectric sensor 24c. Each photoelectric sensor receives light beam which has not been shielded by the edge portion to the wafer W and therefore, the photoelectric signal which is outputted from each photoelectric sensor varies depending on the position of the edge portion of the wafer W.

Now, the main control system MCS servo controls the position of the exposure stage 1' and the rotation of the wafer holder 2' so that levels of photoelectric signals S1, S2 and S3 from each photoelectric sensors 24a, 24b and 24c become predetermined commands or desired values Sa, Sb and Sc, respectively. The desired values Sa, Sb and Sc according to the present embodiment are set to half (50%) of the values which correspond to levels of photoelectric signals measured when the parallel beams of light are irradiated to the entire photoelectric sensors. Thus it is possible to make the position of the center points at longitudinal direction of each photoelectric sensor coincide with the position of wafer edges on the three points by controlling the position of the exposure state 1' and the rotation of the wafer holder 2'. In this case, the main control system MCS obtains displacement value D1, D2 and D3 between the position of edges at the three points of the wafer W and the center position of each photoelectric sensor on the basis of the photoelectric signals from each of the photoelectric sensors. The displacements are generally expressed by following formulae using constants K1, K2 and K3.

$$D1=K1(S1-Sa)$$

$$D2=K2(S2-Sb)$$

$$D3=K3(S3-Sc)$$

The main control system MCS obtains a displacement ($\Delta X$, $\Delta Y$) of the exposure stage 1' (an offset value between the position of the wafer W and the position of the wafer holder 2') and a revolution angle or angular offset $\Delta\theta$ of the wafer holder (the rotational errors between the direction of the flat of the wafer W and the X direction) on the basis of the above positional displacement values and using the following formulae.

$$\Delta X=-D3$$

$$\Delta Y=(D1+D2)/2$$

$$\Delta\theta=(D2-D1)/L$$

Figure 9B:
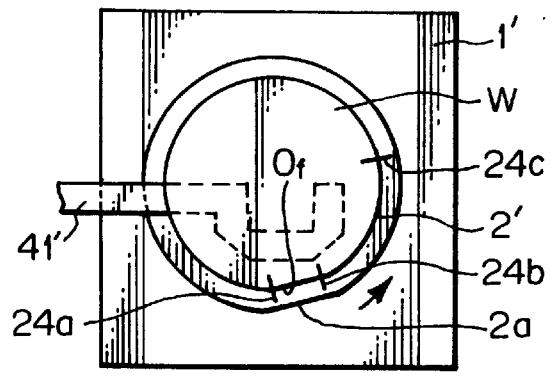
FIG. 9(b) is a top plan view of a state in which the wafer is positioned relative to the substrate stage and a substrate holder.

In the above formulae, L is a distance between the photoelectric sensors 24a and 24b along the X direction. The main control system MCS servo controls movement of the exposure stage 1' toward Y and Y directions and rotation of the wafer holder 2' using these displacement and rotation values ($\Delta X$, $\Delta Y$, $\Delta\theta$) as control deviation signals. FIG. 9(b) shows the state at the time when the movement of the exposure stage 1' and the rotation of the wafer holder 2' have finished. At this time, the edges of wafer W are projected on the center position in the longitudinal direction of the each photoelectric sensors 24a, 24b and 24c.

Figure 9C:
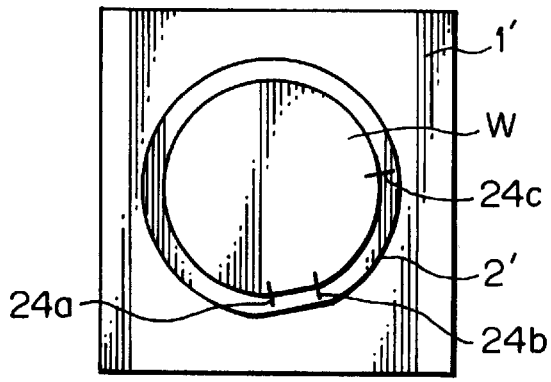
FIG. 9(c) is a top plane view showing a state in which the substrate is disposed on a substrate holder.
Figure 9D:
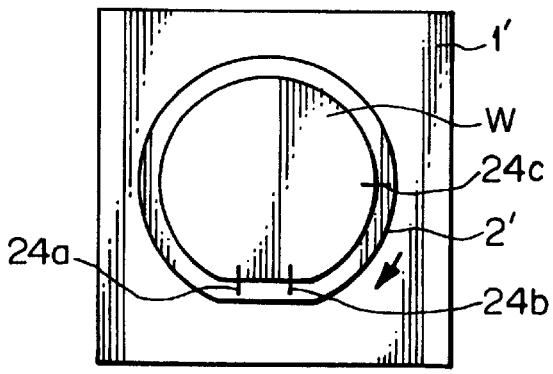
FIG. 9(d) is a top plan view showing a state in which the substrate holder is returned to an original position.

After the movement of the exposure stage 1' and the rotation of the wafer holder 2' have finished as mentioned above, the main control system MCS moves the wafer up and down or supporting pins 54a', 54b40 and 54c' upwardly and downwardly. The carrier arm 20 is retracted from over the exposure stage 1' after the wafer supporting pins 54a', 54b' and 54c' received the wafer W from the carrier arm 41'. The wafer holder, after receiving the wafer, holds the wafer W by suction due to negative pressure or vacuum. The state is shown in FIG. 9(c). Finally, the direction or orientation of the flat in the wafer is arranged in parallel with the X direction by returning the wafer to the initial position (the neutral position) in the direction of rotation before the wafer is place thereon. The state at that time is shown in FIG. 3(d). After positioning operation of the wafer has completed, the main control system then disposes the exposure stage 1' below the exposure optical system PL to perform an exposure operation and an operation of fine alignment.

It is possible to rapidly and precisely position the wafer with respect to the exposure stage so that the direction of the flat in the wafer and the reference direction (X direction) becomes parallel when the wafer is the neutral position by means of the positioning apparatus for the wafer and the operation thereof. Moreover, according to the present invention cost of the positioning apparatus is reduced since the pre-alignment device PAS used in the present embodiment is not such a precise device as that of conventional devices.

Figure 3B:
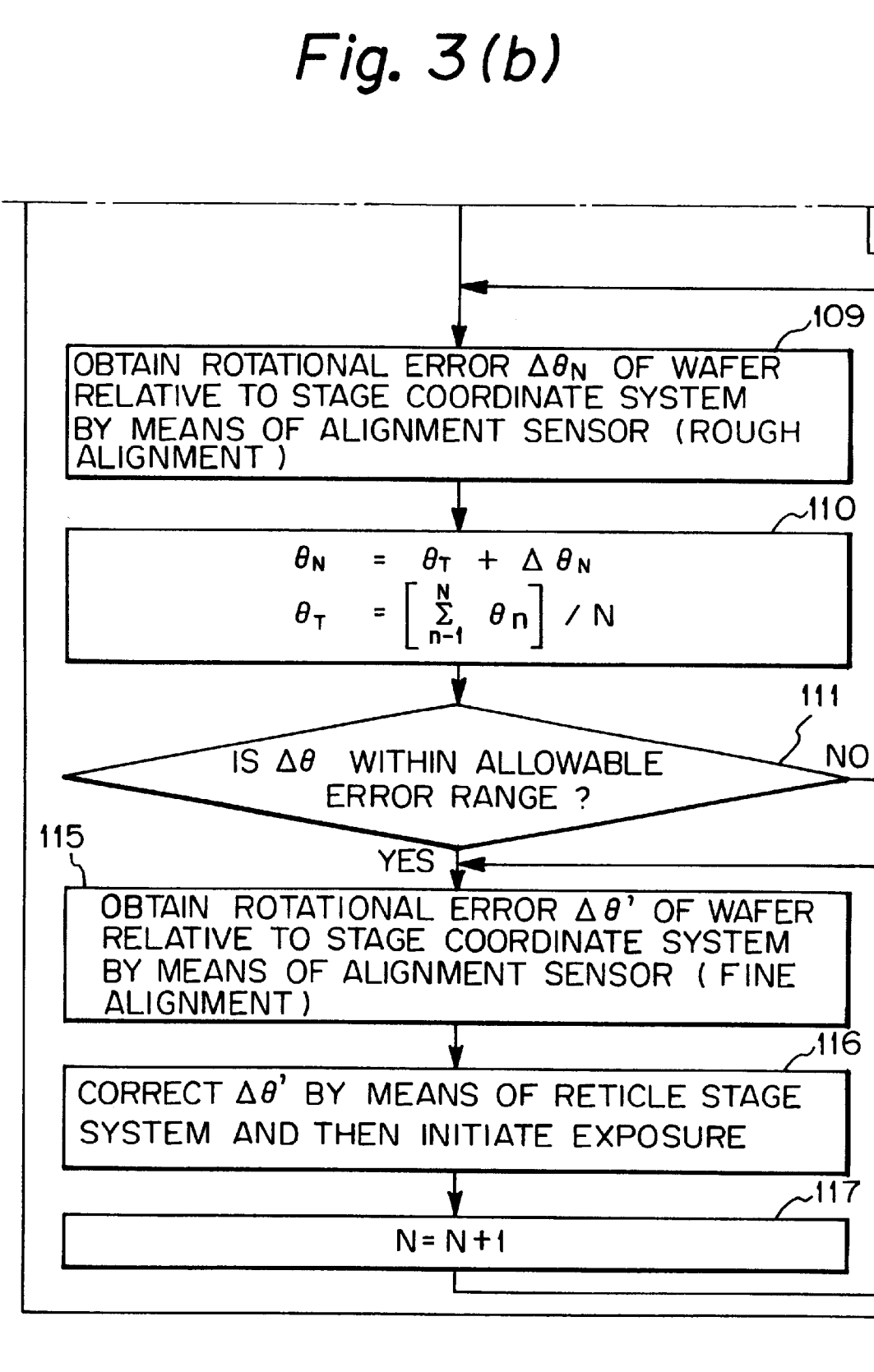

Incidentally, the position of the wafer will shift with respect to the wafer holder 2' due to a mechanical play of the wafer up and down or supporting pins 54a, 54b, and 54c' when the positioning apparatus according to the present embodiment changes from the state wherein the movement of the exposure stage 1' and the rotation of the wafer holder 2' have finished (the state shown in FIG. 3(b)) to the state wherein the wafer holder 2' holds the wafer W (the state shown in FIG. 9(c)). Thus the main control system MCS can obtain the offset or displacement value $\Delta X$, $\Delta Y$ between the position of the wafer W and the position of the wafer holder 2', and an angular offset value or rotational error $\Delta\theta$ of the wafer with respect to the wafer holder caused under the state (the state shown in FIG. 9(c)) wherein the wafer holder is holding the wafer W, by irradiating again the laser beams from the parallel beam illumination system 25a, 25b and 25c to the wafer and input the photoelectric signals from the photoelectric detectors or sensors 24a, 24b and 24c to the main control system after the wafer is held by the wafer holder. If the displacement value of the position and the angular offset exceed the predetermined value, as to $\Delta\theta$, rotation of the wafer holder is compensated when the wafer holder 2' is returned to the neutral position and as to $\Delta X$ and $\Delta Y$, the position of the exposure stage is compensated by using as offset value when a projection operation or a fine alignment operation is performed.

Figure 10A:
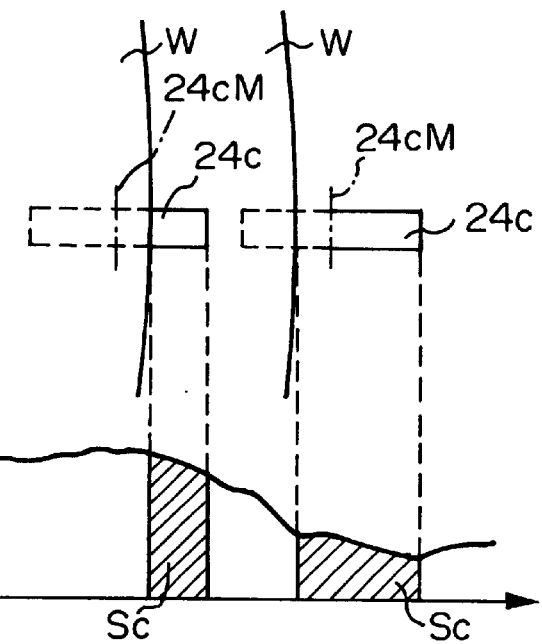
FIG. 10(a) is a partial plan view showing errors occurring as a result of calculation of displacement or offset value D1~D3 by a main control system SMC.
Figure 10B:
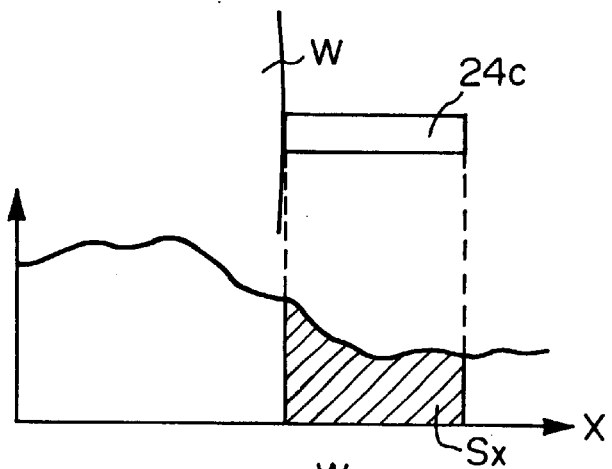
FIGS. 10(b) and 10(c) are partial plane view explaining an operation for decreasing calculation errors of the displacement values D1~D3.
Figure 10C:
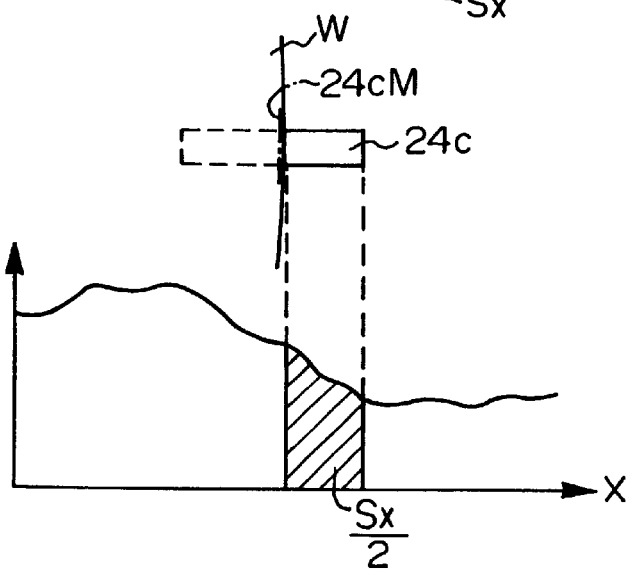

Since, in this embodiment, the intensity of the light within the irradiation area of the laser beam irradiated from the parallel beam illumination systems 25a, 25b and 25c is considered to be substantially constant, positioning of the wafer is performed assuming that the desired values Sa, Sb and Sc of the levels S1, S2 and S3 of the photoelectric signals are usually constant. However, if these desired values Sa, Sb and Sc are constant even though, for example, there is irregularity in the intensity of the light within the irradiation region, some errors will be caused in the result of the calculation of the above displacement or offset values D1, D2 and D3. Considering, for example, the photoelectric detector or sensor 24c, if the edge portion of the wafer is carried to a position above the exposure stage 1' is in the position at which the intensity of the light is relatively high, the center position 24cM of the photoelectric sensor 24c will shift from the position of the wafer edge toward the −X direction when the exposure stage 1' is positioned so that the level S3 of the photoelectric signal from the photoelectric sensor 24c approaches the desired value Sc (hatched portion in FIG. 10(a)). On the contrary, if the edge portion of the wafer is in the position at which the intensity of the light is relatively low, the center position 24cM of the photoelectric sensor 24c will shift from the position of the wafer edge toward the +X direction, when the exposure stage 1' is positioned. Thus, if the wafer is carried to the position above the exposure stage 1', the main control system MCS once positions the photoelectric sensor 24c near the wafer edge as shown in FIG. 10(b) and detects the level Sx of the photoelectric signal at the time when the laser beam is irradiated to the whole of light receiving surface of the photoelectric sensor 24c, thereby setting half (Sx/2) of the detected level as a desired value. This is true of the other photoelectric detectors or sensors 24a and 24b and therefore, a more precise positioning of the substrate is performed by positioning the exposure stage 1' after setting desired values of the photoelectric signals from the photoelectric sensors.

Although, in the above embodiment, a detecting system for detecting the wafer edge is constituted by the parallel beam illumination systems 25a, 25b and 25c and the photoelectric detectors or sensors 24a, 24b and 24c, it is possible to adopt a structure wherein a light source is disposed on the wafer holder and the laser beam is irradiated to an under side of the wafer from the light source and receives the beam by a photoelectric detector or sensor disposed above the wafer. It is possible to adopt the other modified structures wherein a camera element such as a television camera, CCD or the like takes a picture of the edge of the wafer and detects the position of the wafer edge.

Figure 11:
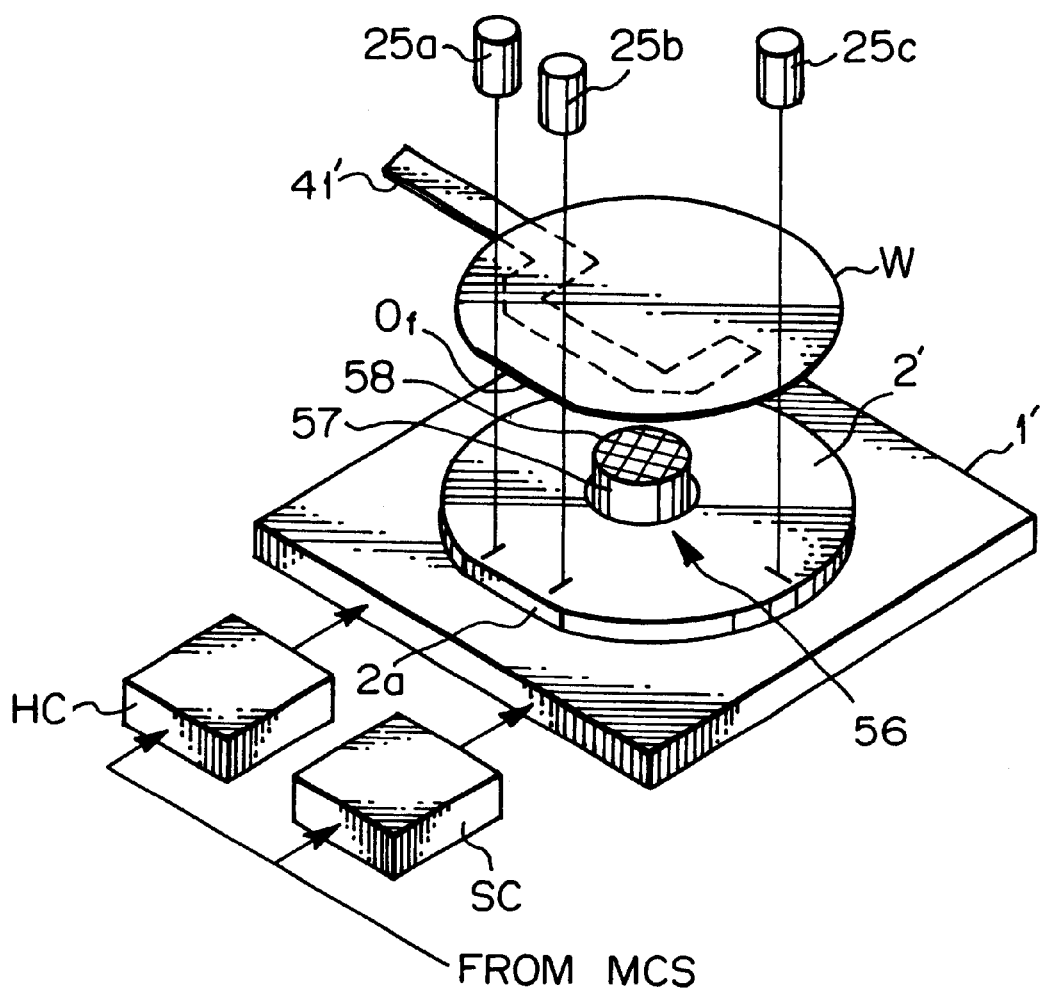
FIG. 11 is a perspective view showing a schematic structure of a positioning apparatus for a substrate according to a modified example of said other embodiment.
Figure 12A:
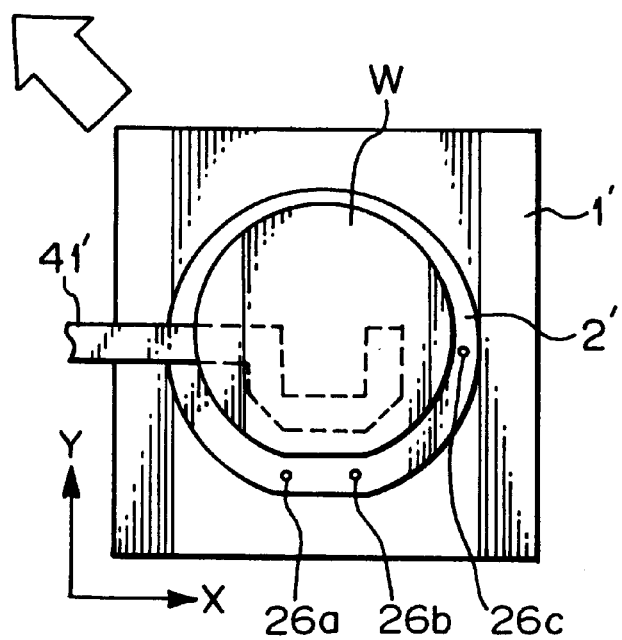
FIG. 12(a) is a top plane view showing a schematic structure of a positioning apparatus for a substrate according to a further embodiment of the present invention.
Figure 12B:
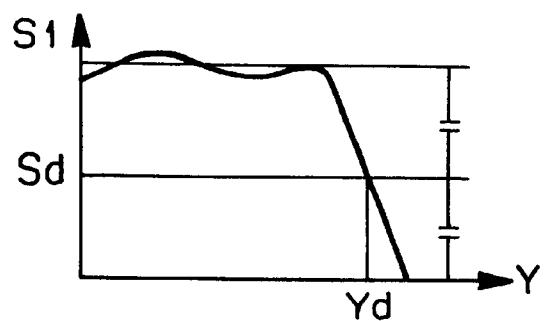
FIGS. 12(b)~12(d) are views of graphs showing, signal waves of photoelectric signals obtained from a miniature photoelectric sensor.
Figure 12C:
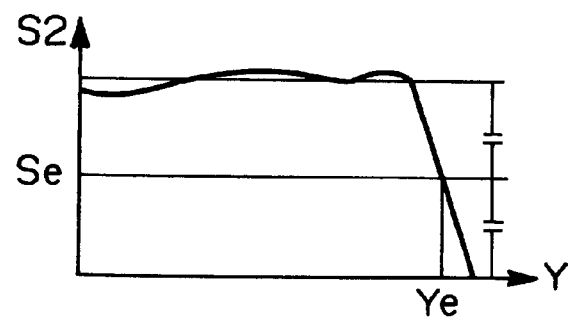
Figure 12D:
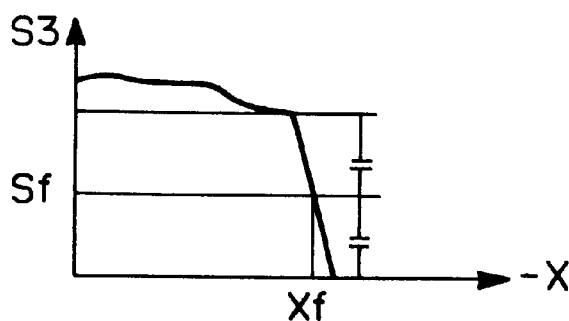

A modified embodiment will be explained hereinafter referring to FIG. 11. FIG. 11 is a perspective view of the modified embodiment showing an outline of the positioning apparatus according to the modified embodiment. The positioning apparatus of this modified embodiment has a rotary driver 56 provided on the exposure stage 1' and rotating the wafer W, in place of the wafer supporting pins 54a' to 54c' in the first modified embodiment.

The wafer rotary driver 56 includes a movable post 57 disposed at a substantial center of the wafer holder and rotatable and upwardly and downwardly movable with respect to the wafer holder 2' at the center of the wafer holder. The rotary post is rotated reciprocally and moved up and down by a unshown drive mechanism. The rotary post receives on it's top surface a substantial center portion of the wafer and support the wafer. The drive mechanism may be one of known mechanisms which can optionally control minute angle of rotation. The up and down motion and the rotation of the rotary post 57 are controlled by a rotary control system HC. The structure of the exposure stage 1' other than the wafer rotary driver 56 and the rotary drive system is the same as that of the first modified embodiment and therefore, detailed explanation of the structure and function of the exposure stage which are common with the first modified embodiment is omitted.

In this modified embodiment, at first the wafer W is mounted on the rotary post 57 of the rotary driver 56. The rotary post 56 holds the wafer by, for example, a vacuum suction. Then the main control system MCS obtains displacement or offset values between the position of edges of the wafer at three points and the center position of the photoelectric sensors, while obtaining positional displacement values $\Delta X$ and $\Delta Y$ between the wafer W and the wafer holder 2' and rotational error $\Delta\theta$ between the direction of the flat of the wafer and the reference direction (X direction) in the same way as explained in the first embodiment. The main control system MCS outputs a command signal to the rotary control system on the basis or the rotational error $\Delta\theta$ and rotates the movable post 57 so that the direction of the flat become parallel with the reference direction (X direction). Then, the wafer W is mounted or placed on the wafer holder 2' after the movable post has been moved downwardly and holding of the wafer by vacuum suction has been released. The positional displacement values $\Delta X$ and $\Delta Y$ is used as offset values to compensate the position of the exposure stage 1' when the exposure operation and the fine alignment operation are performed. With the structure and operation as explained above, the wafer W can be quickly and precisely positioned on the stage 1' in the same way as the first embodiment even though, for example, no rotating mechanism is provided on the wafer holder 2'.

In this modified embodiment the positional displacement values $\Delta X$ and $\Delta Y$ and the rotational error $\Delta\theta$ are detected after the wafer W is held on the movable post 57, but the positional displacement values $\Delta X$ and $\Delta Y$ and the rotational error $\Delta\theta$ can be detected while the wafer is held by the carrier arm 41'. In this case, the exposure stage 1' may be slightly moved toward the X and Y directions before holding the wafer W on the wafer holder 2' in order to make the positional displacement or offset values ΔX and ΔY zero, and the movable post 57 may be rotated after holding the wafer W on the wafer holder 2' in order to achieve a rotational error of zero. Moreover, although the above modified embodiment adopts a structure wherein the movable post 57 may be rotated in order to make the rotational error Δθ zero, it is possible to adopt a further modified structure wherein the three pins 54a', 54b' and 54c' shown in FIGS. 8(*a*) and 8(*b*) are integrally rotatable and the rotational errors or angular offset Δθ are zero by rotating the three pins.

Referring to FIGS. 12(*a*) to 12(*d*), a second modified embodiment of the positioning apparatus will be explained hereinafter. In this embodiment photoelectric detectors or sensors 26a, 26b and 26c having a minute light receiving area (hereinafter referred to as "minute photoelectric sensor") are provided in place of the photoelectric sensors 24a, 24b and 24c shown in the first modified embodiment in order to reduce the above displacement or offset values D1, D2 and D3 caused by irregularity in intensity of laser beams from the parallel beam illumination systems 25a, 25b and 25c shown in the first modified embodiment. The structures of the components of this embodiment other than the photoelectric sensors 26a, 26b and 26c are the same as those shown in the first embodiment, respectively, and therefore detailed explanation about the structures and functions is omitted.

FIGS. 12(*a*)–12(*d*) are top views showing a relative positional relation among the wafer W, the exposure stage 1', the wafer holder 2' and the minute photoelectric sensors 26a, 26b and 26c disposed on the wafer holder 2' and corresponds to FIG. 9(*a*) showing the first embodiment.

The main control system MCS detects the position of the edge portions at three points on the wafer W after the wafer W is arranged above the exposure stage 1' in the same manner as the positioning operation of the first modified embodiment. At this time, the main control system MCS disposes the exposure stage 1' at a position offset or displaced from the transfer position in the +X direction and the −Y direction by several millimeters, so that the whole light receiving surfaces of all of the minute photoelectric sensors 26a, 26b and 26c receive the laser beams from the parallel beam illumination systems, respectively. The main control system MCS then scans the exposure stage 1' in a direction designated by an arrow and inclined by 45 degrees in +X direction and the −Y direction, respectively. At this time, the main control system MCS memorizes the photoelectric signals from the minute photoelectric sensors 26a and 26b as functions of a Y-coordinate position of the exposure stage 1'.

FIGS. 12(*b*) to 12(*d*) respectively show signal waves from the minute photoelectric detectors or sensors, which are memorized in the main control system MCS. As shown in these FIGS. 12(*b*) to 12(*d*), levels S1, S2 and S3 of respective photoelectric signals change depending on the position of the exposure stage 1' because of irregularity in the intensity of light of the laser beams before the minute photoelectric sensors 26a, 26b and 26c hide behind the wafer W. The level of the photoelectric signals rapidly decreases when the minute photoelectric sensors 26a, 26b and 26c begin to hide behind the wafer edge and become zero when they hide behind the wafer W completely. The main control system NCS obtains values Sd, Se and Sf which are half of the respective signals at the time when they begin to decrease as desired values of the levels S1, S2 and S3 of the photoelectric signals on the basis of these signal waves and at the same time obtains coordinate values Yd, Ye and Xf at that time. The main control system MCS controls the X-Y coordinate position of the exposure stage and the position of the wafer holder 2' in the direction of rotation on the basis of these signals so that the levels S1, S2 and S3 of the photoelectric signals become the desired values, respectively. After the movement of the exposure stage 1' and the rotation of the wafer holder 2' have finished, the wafer W is held on the wafer holder 2' in the same manner as the first embodiment and the position of the wafer holder 2' in the direction of rotation is returned to the neutral position, thereby completing positioning operation.

It is possible to precisely position the wafer on the exposure stage by the structure and the operation of the positioning apparatus as explained above, even if the intensity of the illuminated light from the parallel beam illumination system is not uniform. Even in this embodiment it is possible to employ the structure wherein the three pins 54a40, 54b' and 54c' movable upwardly and downwardly or the movable post 57 for transferring the wafer W from the carrier arm 41' to the wafer holder 2' may be rotated, in place of the above structure wherein the wafer holder 2' itself is rotated.

In the above first and second modified embodiments, photoelectric detectors or sensors 24a, 24b and 24c are disposed and fixed on the exposure stage 1'. However, it is possible to use a structure wherein for example, a slit plate having elongated rectangular openings formed therein is disposed on the wafer and light passing through the respective rectangular openings is directed to the light receiving surface of each photoelectric sensor disposed outside of the exposure stage 1' via an optical fiber (or mirror and etc.). Moreover, in the case where the illumination systems 25a, 25b and 25c are disposed on the exposure stage 1', sources of light emitting illumination light may be provided at the outside or the exposure stage 1' and illuminate the edge portions of the wafer W by introducing the illumination light to the exposure stage 1' through optical fibers and the like. At this time a light emitting end of each optical fiber may be formed into an elongated rectangular shape and positioned on the wafer holder 2', or a slit plate having elongated rectangular openings may be disposed on the wafer holder 2' and irradiated at a back surface of the slit plate by the illumination light emitted from the optical fiber.

Figure 13:
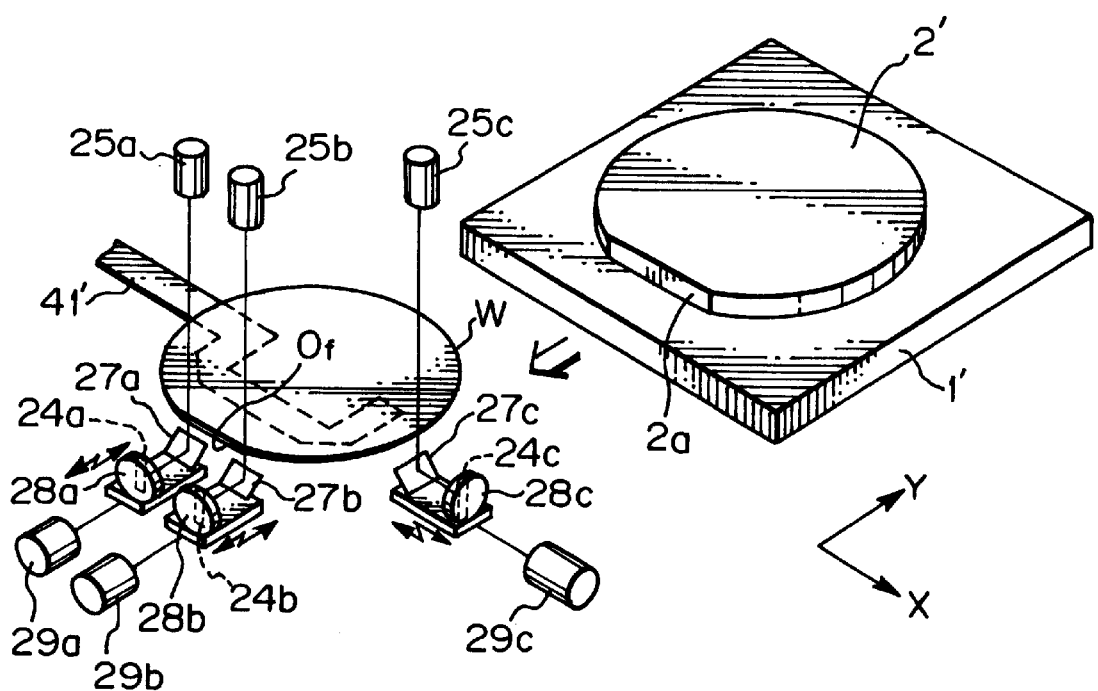
FIG. 13 is a perspective partially exploded view showing a schematic structure of a positioning apparatus for a substrate according to a yet other embodiment of the present invention.

Next, a positioning apparatus for a substrate according to the third modified embodiment of the present invention will be explained hereinafter referring to FIG. 13. FIG. 13 is a perspective view showing a schematic structure of the positioning apparatus for a substrate according to the third embodiment. This embodiment is an example wherein the photoelectric detectors or sensors 24a, 24b and 24c shown in the first modified embodiment are disposed in a place different from the wafer holder 2', but the structure of components thereof are the same as those of the first embodiment and therefore, detailed explanation regarding the structure of the positioning apparatus is omitted herein. The same reference characters as those of the first embodiment are used for the components of this embodiment having the same function as those of the first embodiment.

FIG. 13 shows a state wherein the wafer is arranged at the transfer position by the carrier arm 41'. The laser beams are irradiated from the parallel beam illumination systems 25a, 25b and 25c before the wafer is mounted on the wafer holder 2'. An exposed image of the wafer edges are reflected by mirrors 27a, 27b and 27c and respectively received by the photoelectric sensors 24a, 24b and 24c disposed in light receiving sections 28a, 28b and 28c. Levels of the photoelectric signals output from these photoelectric sensors 24a, 24b and 24c change depending to the position of the wafer edges in the same way as the first embodiment. Moreover, the mirror 27a and the light receiving section 28a are integrally movable in the Y direction by a drive device 29a and the mirror 27b and the light receiving section 28b are integrally movable in the Y direction by a drive device 29b. The mirror 27c and the light receiving section 28c are integrally movable in the X direction by a drive device 29c. The main control system MCS controls movement of the mirrors and the light receiving sections via these drive devices 29a, 29b and 29c.

The photoelectric sensors 25a, 25b and 25c which receive the beams of light from the parallel beam illumination systems 24a, 24b and 24c, respectively, output photoelectric signals corresponding to the intensity of the received laser beams to the main control system MCS. The main control system MCS obtains the positional offset or displacement values $\Delta X$ and $\Delta Y$ from the transfer position of the wafer W and the rotational error (angular offset value) $\Delta\theta$ of the flat with respect to the X direction on the basis of these photoelectric signals by the calculation same as that used in the first modified embodiment. The exposure stage may be in any position at that time. The main control system MCS controls the position of the exposure stage and the position of the wafer holder 2' in the direction of rotation on the basis of these positional offset or displacement values and the rotational errors or angular offset values ($\Delta X$, $\Delta Y$, $\Delta\theta$) when the wafer is mounted on the wafer holder 2'. At this time the exposure stage 1' is arranged at a position which is displaced from the reference position by ($\Delta X$, $\Delta Y$) and the position of the wafer holder 2' in the direction or rotation is a position which is offset from the neutral position by $\Delta\theta$. When the wafer W is mounted on the wafer holder 2', the main control system MCS outputs command signals to the drive device 29a, 29b and 29c to move the mirrors 27a, 27b and 27c and the light receiving sections 28a, 28b and 28c so that the mirrors escape from under the wafer W. After holding the wafer W by the wafer holder 2', the wafer holder 2' is returned to the neutral position in the same way as the first embodiment, thereby completing the positioning operation of the wafer W.

With the structure and the operation of the positioning apparatus as described above, it is possible to position the wafer W on the exposure stage 1' without providing any photoelectric sensors or the like on the wafer holder 2'. With the structure as explained above, the throughput of the apparatus is improved, since the positional offset or displacement of the wafer is measured beforehand without effecting detection of the positional offset of the wafer when the wafer is exchanged.

Although, in the above embodiments the positional displacement values $\Delta X$ and $\Delta Y$ are made zero by slightly moving the exposure stage 1' in X and Y directions before holing the wafer W by the wafer holder 2', it is possible to use, for example a structure wherein the carrier arm 41' is slightly movable in X and Y directions and the wafer W mounted on the carrier arm 41' is transferred to the wafer holder via the three pins 54a', 54b' and 54c' or the movable post 57 after the positional displacement or offset values $\Delta X$ and $\Delta Y$ are made zero by moving the carrier arm 41' upon which the wafer W is mounted relative to the exposure stage 1' (wafer holder 2'). Moreover, in place of the wafer holder 2' and the movable post 57 (or the three pins 54a', 54b' and 54c'), a modified structure can be adopted wherein the carrier arm 41' is made rotatable and is rotated so that the rotational errors or angular offset values $\Delta\theta$ become zero and thereafter the wafer on the rotated carrier arm 41' is transferred to the wafer holder via the three pins 54a', 54b' and 54c' or the movable post 57.

Furthermore, although, the above modified embodiments use the three pins 54a', 54b' and 54c' or the movable post 57 and transfer the wafer between the carrier arm 41' and the wafer holder 2', the wafer holder 2', for example, may be movable up and down to transfer the wafer W. In such a case, the wafer W is transferred onto the three pins 54a', 54b' and 54c' (or the movable post 57) after descending the carrier arm 41' which is moved over the exposure stage 1', and thereafter the wafer holder 2' is elevated and the wafer W is held by vacuum suction, then exposure operation is performed after driving the exposure stage 1' keeping this state.

A carrier device provided between the loading wafer cassette 45 and the pre-alignment device PAS and between the pre-alignment device PAS and the unloading wafer cassette 46 is not limited to the belts 47a, 47b and 48a, 48b shown in FIG. 7. A combination of the guide 43' and the slider (carrier arm) 41' each shown in FIG. 7 or a carrier robot shown in the U.S. Pat. No. 4,836,733 may be used in place of the above carrier device.

According to the first positioning method of this invention, the direction of a mark formed on a photosensitive substrate (wafer) can be adjusted with respect to the longitudinal direction of a band-shaped light beam, and a detection error based on a rotational error between the band-shaped light beam and the mark is removed. Also, since, for example, an angle of rotation or revolution of the photosensitive substrate is determined in relation to the direction of the band-shaped light beam, it is not necessary to mechanically or optically adjust the direction of the band-shaped light beam with high accuracy. This is advantageous in that the cost of manufacturing a semiconductor device and the like is reduced.

In addition, in the case where the photosensitive substrate is positioned on a substrate stage in consideration of a relationship between the longitudinal direction of the band-shaped and a predetermined direction, adjustment of the photosensitive substrate and a mask pattern is completed when the photosensitive substrate is placed on the substrate and therefore, the direction of the substrate stage does not need to be adjusted. Therefore, the throughput (productivity) is improved and no mechanism for adjusting the direction of the mask pattern and the photosensitive substrate is necessary.

According to the second positioning method of this invention, a rotational error of the photosensitive substrate relative to a predetermined coordinate system is adjusted when the substrate is placed again on a substrate holder and therefore an alignment of the photosensitive is quickly carried out. This results in an improvement of the throughput.

Moreover, in the case where a small rotational error of the photosensitive substrate with respect to a two dimensional coordinate system is measured after correction of the rotational error of the photosensitive substrate is carried out and the mask pattern is rotated so as to correct the small rotational error, it is not necessary to provide, for example, on the substrate stage, a mechanism for correcting the small rotational error. For this reason, the weight of the substrate stage is reduced and the stiffness thereof is increased and thus the accuracy of stabilization at the time of a stepping operation is improved and the stabilization time is reduced. A correcting operation which is carried out at the substrate stage also becomes simple.

According to the positioning apparatus of the present invention, it is possible to position in rapid and with high precision the substrate with respect to the stage by detecting a straight portion on the periphery of the substrate above the holder in non-contact fashion when the substrate is mounted on the holder. Moreover, since the wafer W is set on the holder so that the direction of the straight portion (flat) on the periphery of the substrate is always oriented in a predetermined direction with respect to the reference direction or reference line when the holder is in the neutral position, the flat Of of the substrate does not offset from the reference direction over the range or rotation of the wafer holder when the wafer holder is rotated at the time of the exposure operation and the fine-alignment operation.

The foregoing disclosure is the best mode devised by the inventors for practicing the subject invention. It is apparent, however, that apparatus incorporating modifications and variations will be obvious to those skilled in the art of the positioning apparatus for a substrate. Inasmuch as the foregoing disclosure is intended to enable those skilled in the art to practice the instant invention, it should not be construed to include such aforementioned obvious variations and be limited only by the spirit and scope of the following claims.

What is claimed is:

1. An exposure apparatus that forms an image of pattern on a substrate through an optical projection system, comprising:
    a stage disposed on an image plane side of said optical projection system, said stage having a holder which holds said substrate;
    a transfer device that transfers said substrate to the holder and holds said substrate at a reference position defined in a region within which said stage is movable before said transfer device transfers said substrate to the holder; and
    a detecting system that detects positional information of said substrate held by said transfer device at the reference position before said transfer device transfers the substrate to the holder.

2. An apparatus according to claim 1, wherein said detecting system detects an edge of said substrate at a plurality of points.

3. An apparatus according to claim 2, wherein said detecting system has a part thereof disposed on said stage.

4. An apparatus according to claim 2, wherein said detecting system is retracted from said reference position so as to allow said substrate to be transferred from said transfer device to said stage.

5. An apparatus according to claim 2, wherein said transfer device comprises a movable member for holding said substrate, said transfer device being disposed between a standby position of said substrate and said reference position.

6. An apparatus according to claim 5, further comprising a transfer mechanism which moves said holder and said substrate relative to each other to transfer said substrate from said transfer device to said stage.

7. An apparatus according to claim 6, wherein said transfer mechanism includes a support member provided on said stage and wherein said support member moves said substrate relative to said holder.

8. An apparatus according to claim 6, wherein said transfer mechanism compensates a positional error of said substrate based on an output of said detecting system.

9. An apparatus according to claim 2, wherein said transfer device is movable and disposed on said stage.

10. An apparatus according to claim 9, wherein said substrate is transferred to said holder by said transfer device.

11. An apparatus according to claim 9, wherein said transfer device compensates a positional error of said substrate based on an output of said detecting system.

12. An apparatus according to claim 2, further comprising a compensating device connected to said detecting system, said compensating device compensating a positional error of said substrate.

13. An apparatus according to claim 12, wherein said compensating device moves said holder and said substrate relative to each other based on an output of said detecting system.

14. An exposure apparatus comprising:
    a stage provided with a reflecting surface, said stage having a holder which holds an object;
    an interferometer which irradiates a light beam onto said reflecting surface;
    a transfer device that transfers said object to the holder and holds said object at a reference position defined in a region within which said stage is movable before said transfer device transfers said object to the holder; and
    a detecting system that detects positional information of said object held by said transfer device at the reference position before said transfer device transfers the object to the holder.

15. An apparatus according to claim 14, wherein said transfer device is separated from said stage and disposed at said reference position.

16. An apparatus according to claim 15, wherein said transfer device is movable and moves said object relative to said holder.

17. An apparatus according to claim 16, wherein said detecting system has a part thereof disposed on said stage.

18. An apparatus according to claim 16, wherein said detecting system is retracted from said reference position so as to allow said object to be transferred from said transfer device to said stage.

19. An apparatus according to claim 16, further comprising a compensating device connected to said detecting system, said compensating device compensating a positional error of said object.

20. A method of forming an image of a pattern on a substrate through an optical projection system, comprising:
    holding said substrate by means of a transfer device which transfers said substrate to a holder disposed on a stage, at a reference position defined in a range within which said stage is movable to move said substrate relative to said optical projection system; and
    detecting positional information of the substrate held by said transfer device at the reference position before said transfer device transfers the substrate to the holder.

21. A method according to claim 20, wherein said positional information is obtained by detecting an edge of said substrate at a plurality of points.

22. A method according to claim 21, wherein said positional information is detected by means of a detecting system having a portion thereof disposed on said stage.

23. A method according to claim 22, further comprising:
    transferring, at said reference position, said substrate from said transfer device to said stage.

24. A method according to claim 21, further comprising:
    retracting a detecting system which detects said positional information from said reference position and disposing said stage at said reference position so as to allow said substrate to be transferred from said transfer device to said stage.

25. A method according to claim 21, further comprising:
    moving said substrate and said holder relative to each other so as to allow said substrate to be transferred from said transfer device to said stage.

26. A method according to claim 25, further comprising:

compensating a positional error of said substrate based on said obtained positional information.

27. A method according to claim 26, wherein said positional error is compensated while said substrate is transferred.

28. A method according to claim 26, wherein said positional error is compensated during movement of said stage holding said substrate.

29. A method according to claim 21, further comprising:

carrying said substrate from a predetermined position outside of said range to said reference position;

wherein said substrate is held at said reference position by means of said transfer device which carries said substrate.

30. A method according to claim 21, further comprising:

carrying said substrate from a predetermined position outside of said range to said reference position; and transferring said substrate onto said transfer device disposed on said stage at said reference position.

* * * * *